United States Patent [19]
Ema et al.

[11] Patent Number: 5,661,340
[45] Date of Patent: Aug. 26, 1997

[54] DYNAMIC RANDOM ACCESS MEMORY HAVING A STACKED FIN CAPACITOR WITH REDUCED FIN THICKNESS

[75] Inventors: Taiji Ema; Masaaki Higashitani; Toshimi Ikeda; Michiari Kawano; Hiroshi Nomura; Masaya Katayama; Masahiro Kuwamura, all of Kawasaki, Japan

[73] Assignee: Fujitsu Limited, Kawasaki, Japan

[21] Appl. No.: 141,691

[22] Filed: Oct. 26, 1993

Related U.S. Application Data

[63] Continuation of Ser. No. 914,358, Jul. 17, 1992, abandoned.

[30] Foreign Application Priority Data

| | | | |
|---|---|---|---|
| Jul. 25, 1991 | [JP] | Japan | 3-186155 |
| Sep. 19, 1991 | [JP] | Japan | 3-239045 |
| Feb. 19, 1992 | [JP] | Japan | 4-031754 |

[51] Int. Cl.$^6$ .......................... H01L 23/02; H01L 21/265
[52] U.S. Cl. ............... 257/680; 257/308; 257/71; 257/68; 438/253; 438/254; 438/739
[58] Field of Search ..................... 257/308, 680, 257/71, 68; 437/48, 191, 228, 233, 235, 919

[56] References Cited

U.S. PATENT DOCUMENTS

| | | | |
|---|---|---|---|
| 4,994,404 | 2/1991 | Sheng et al. | 437/44 |
| 5,223,729 | 6/1993 | Kudoh et al. | 257/308 |

FOREIGN PATENT DOCUMENTS

| | | |
|---|---|---|
| 0 295 709 | 12/1988 | European Pat. Off. . |
| 0 318 277 | 5/1989 | European Pat. Off. . |
| 0 415 530 | 3/1991 | European Pat. Off. . |
| 0 449 000 | 10/1991 | European Pat. Off. . |

OTHER PUBLICATIONS

*Patent Abstracts of Japan*, vol. 12, No. 207 (E–621)[3054] Jun. 14, 1988 & JP-A-63 004670 (Hitachi) Jan. 9, 1988.
*Patent Abstracts of Japan*, vol. 13, No. 304 (E–786) Jul. 12, 1989 & JP-A-1 081227 (Hitachi) Mar. 27, 1989.
*Patent Abstracts of Japan*, vol. 13, No. 531 (E–851)[3879] Nov. 28, 1989 & JP-A-1 217956 (Fujitsu) Aug. 31, 1989.
Hayashide et al., "Fabrication of Storage Capacitance–Enhanced Capacitors with a Rough Electrode," *Japanese Journal of Applied Physics*, Extended Abstracts of the 22nd Conference on Solid State Devices and Materials, Sendai, 1990, pp. 869–872.
Watanabe et al., "A New Stacked Capacitor Structure Using Hemispherical–Grain (HSG) Poly–Silicon Electrodes," *Japanese Journal of Applied Physics*, Extended Abstracts of the 22nd Conference on Solid State Devices and Materials, Sendai, 1990, pp. 873–876.
Novak et al., "The Dry Etching of Oxides Using Anhydrous HF," *Japanese Journal of Applied Physics*, Extended Abstracts of the 22nd Conference on Solid State Devices and Materials, Sendai, 1990, pp. 1091–1093.

*Primary Examiner*—Edward Wojciechowicz
*Attorney, Agent, or Firm*—Staas & Halsey

[57] ABSTRACT

A method for fabricating a dynamic random access memory comprises the steps of forming a diffusion region in a semiconductor substrate, providing an insulation layer on the semiconductor substrate, forming a contact hole in the insulation layer to expose the diffusion region at the contact hole, depositing a semiconductor layer on the insulation layer in the amorphous state such that the semiconductor layer establishes an intimate contact with the exposed diffusion region via the contact hole, patterning the semiconductor layer to form a capacitor electrode, depositing a dielectric film on the capacitor electrode such that said dielectric film covers the capacitor electrode; and depositing a semiconductor material to form an opposing electrode such that the opposing electrode buries the capacitor electrode underneath while establishing an intimate contact with the dielectric film that covers the capacitor electrode.

19 Claims, 18 Drawing Sheets

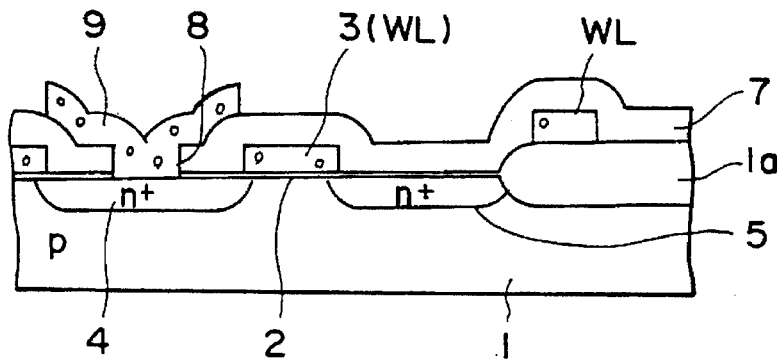
FIG. I(A) PRIOR ART
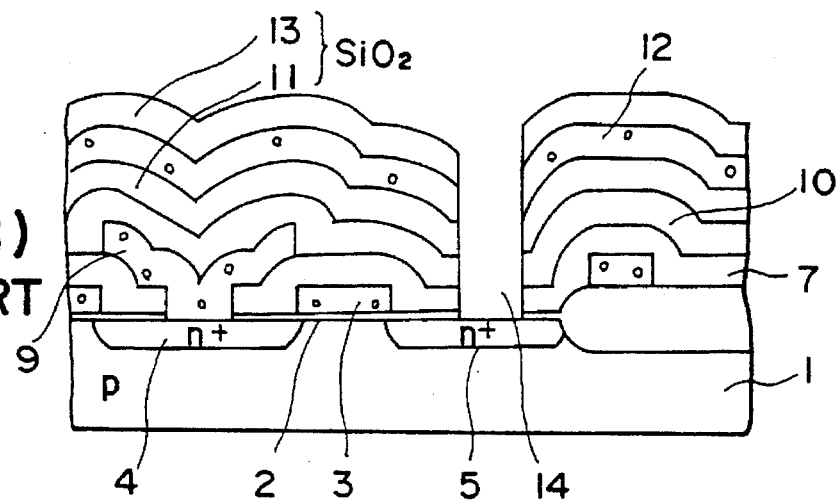
FIG. I(B) PRIOR ART
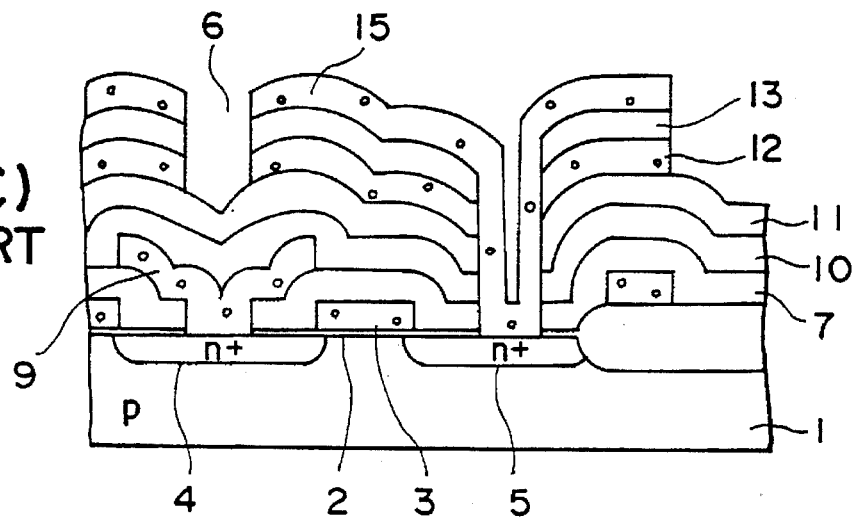
FIG. I(C) PRIOR ART $l_1 > l_2$ $t_C > t_B > t_A$

DYNAMIC RANDOM ACCESS MEMORY HAVING A STACKED FIN CAPACITOR WITH REDUCED FIN THICKNESS

This application is a continuation of application Ser. No. 07/914,358, filed Jul. 17, 1992, now abandoned.

BACKGROUND OF THE INVENTION

The present invention generally relates to semiconductor devices, and more particularly to a dynamic random access memory that has a stacked fin capacitor for increased capacitance of the memory cell capacitors.

The dynamic random access memories (DRAMs) are characterized by the simple device structure in that the device typically includes only a single memory cell capacitor for storing information and a single transfer gate transistor connected to the memory cell capacitor. Thus, the device can be fabricated easily with a large integration density and is suitable for constructing a semiconductor memory device having a large storage capacity. Currently, the devices having a storage capacity of 256 Mbits or 1 Gbits are studied intensively.

In order to fabricate large-scale DRAMs having a large number of memory cells assembled therein various efforts have been made so far. Such efforts of course include the development of the submicron patterning processes that are applicable to the fabrication of the DRAMs having extremely minute memory cells. Particularly, the development of optical lithography applicable to the submicron patterning is essential for the mass production of the DRAMs.

Simultaneously, considerable efforts have been developed for securing sufficient capacitance for the memory cell capacitors while reducing the size of memory cells simultaneously. It should be noted that the reduction of the size of the memory cell capacitor generally invites a reduction in the capacitance of the memory cell. In the DRAMs, the capacitance of the memory cell capacitors is required to be larger than the parasitic capacitance of the bit lines.

One obvious solution to compensate for such a decrease of the capacitance would be to increase the height of the memory cell capacitor such that a sufficient surface area is secured by the increased side wall area of the memory cell capacitor. This approach, however, causes a problem in that there appears a large difference in the level between a memory cell region wherein the memory cells are formed and a peripheral region wherein various peripheral circuits are formed. When such a large difference or step is formed on the surface of the device, the exposure of patterns particularly those extending between the memory cell region and the peripheral region across the boundary between these regions becomes extremely difficult or impossible. It should be noted that one has to use an optical system having a very large numerical aperture for conducting the exposure with submicron resolution, while the use of such a large numerical aperture inevitably reduces the focal depth of the optical system. In fact, an optical system having a focal depth in the order of 0.1 μm has been used for the submicron optical exposure. In such a submicron optical exposure, the surface irregularity caused by the tall memory cell capacitors is detrimental.

In order to reduce the height of the memory cell capacitor and simultaneously to secure sufficient capacitance, the inventor of the present invention has proposed previously a stacked fin capacitor structure for the memory cell capacitor of the dynamic random access memories. In the stacked fin capacitor structure, a number of thin electrode plates or electrode fins are stacked with each other with a mutual separation and in connection with each other, and a thin dielectric film is deposited on the surface of the electrode fins. Further, an opposing electrode is provided to bury the stacked fin electrode by filling the space or gap formed between the electrode fins. Thereby, one can increase the surface area of the memory cell capacitor significantly without increasing the height.

FIGS. 1(A)–1(F) show a conventional process for fabricating a dynamic random access memory that uses the stacked fin structure for the memory cell capacitor.

Referring to FIGS. 1(A), a p-type silicon substrate 1 is subjected to an oxidation process in a wet $O_2$ environment to form a field oxide film 1a of silicon oxide such that the field oxide film 1a covers the substrate 1 except for a device region in which the active part of the device is to be formed. Further, a tin oxide film 2 of silicon oxide is formed on the surface of the substrate 1 in correspondence to the device region by a thermal oxidation process which is conducted in a dry $O_2$ environment. On the substrate 1 thus covered by the field oxide 1a and the oxide film 2, there is provided a polysilicon layer which is patterned subsequently to form a polysilicon word line WL. As usual, the word line WL extends over the oxide film 2 and acts as a gate electrode 3. Thereby, the oxide film 2 located underneath the gate electrode 3 acts as a gate oxide film.

After the gate electrode 3 is formed, an ion implantation of an n-type dopant such as As conducted in accordance with the self-alignment process that uses the gate electrode 3 as a mask, and there are formed diffusion regions 4 and 5 in the substrate 1 at both sides of the gate electrode 3 respectively in correspondence to the drain and source of a MOS transistor. Thereby, the MOS transistor forms a transfer gate transistor. Next, a silicon oxide insulation layer 7 is deposited on the device thus formed by a CVD process such that the word line WL is buried under the insulation layer 7. Further, a contact hole 8 is formed in the insulation layer 7 in correspondence to the source region 4 such that the surface of the substrate 1 and hence the source region 4 is exposed in correspondence to the contact hole 8, and a polysilicon layer is deposited on the layer 7 such that the polysilicon layer establishes a contact with the exposed surface of the source region 4. By patterning the polysilicon layer thus formed, a polysilicon bit line is formed. Thereby the structure of FIG. 1(A) is obtained.

On the structure of FIG. 1(A), a silicon nitride etching stopper 10 is deposited for example by a CVD process, and a silicon oxide layer 11 and a polysilicon layer 12 are deposited successively also by a CVD process. Further, another silicon oxide layer 13 is deposited on the polysilicon layer 12 similarly, and a contact hole 14 is formed through the layers 10–13 as well as through the underlying layers 2 and 7 to expose the upper major surface of the drain region 5 as shown in FIG. 1(B).

Next, a polysilicon layer 15 is deposited by a CVD process to cover the upper major surface of the silicon oxide layer 13 as well as the side wall of the contact hole 14 and further the surface of the drain region 5 exposed by the contact hole 14. Further, an RIE process is applied to form a groove 6 that extends substantially vertically from the upper major surface of the polysilicon layer 15 to the upper major surface of the etching stopper 11 such that the groove 6 defines each memory cell capacitor. In other words, each memory cell capacitor is separated from adjacent memory cell capacitors by the groove 6. See the structure of FIG. 1(C).

Next, an wet etching process using a HF etchant is applied to the structure of FIG. 1(C) to dissolve the silicon oxide layers 11 and 13. Thereby, the etching acts selectively upon silicon oxide and a structure shown in FIG. 1(D) is obtained. There, it will be noted that there is formed a stacked fin electrode 16 including a plurality of electrode fins formed of the polysilicon layers 12 and 15 such that the electrode structure 16 establishes a contact with the exposed upper major surface of the drain region 5.

Further, a silicon nitride film 17 is deposited on the exposed surface of the electrode 16 including the surface of the electrode fins 12 and 15 by a CVD process, and the structure thus formed is subjected to a thermal oxidation process for eliminating any pin holes formed in the silicon nitride film 17. Further, a polysilicon layer 18 is deposited also by a CVD process as an opposing electrode such that the polysilicon layer 18 fills the gap between the electrode fins and buries the electrode 16 underneath. Thereby, a dynamic random access memory as shown in FIG. 1(F) is obtained. In the device having the structure shown in FIG. 1(F), it will be noted that the surface area of the memory cell capacitor is increased significantly without increasing the height thereof. Thus, the device has been used successfully for the dynamic random access memories having the storage capacitor of up to 64 Mbits.

On the other hand, when the device having the structure of FIG. 1(F) is used for the DRAMs having a larger storage capacity such as 256 Mbits or more, the decrease of the thickness of the electrode fin becomes essential for compensating for the decreased capacitance. When the thickness of each electrode fin can be reduced successfully, the number of the fins and hence the capacitance of the memory cell capacitor would be increased. Thus, intensive investigations have been made to form the electrode fin as thin as possible.

In the effort to reduce the thickness of the electrode fin, the inventor of the present invention has discovered that there are cases wherein the electrode fins forming the stacked memory cell capacitor are deformed or bent as shown in FIG. 2. When this occurs, the electrode fins are contacted with each other and the capacitance of the memory cell capacitor is decreased inevitably. It was found further that such a deformation occurs particularly in the step of FIG. 1(D) for removing the oxide layers 11 and 13 by the wet etching process and in the step of providing the dielectric film 17 on the surface of the electrode fins. It is believed that the removal of the silicon oxide layer underlying the electrode fin causes the disappearance of the mechanical support of the electrode fin, and the electrode fin is subjected to a large thermal stress acting on the surface of the fin. Such a thermal stress is caused as a result of the difference in the thermal expansion between the polysilicon layer 12 or 15 and the silicon oxide layer 11 or 13. When the thermal stress exceeds the yielding strength of the polysilicon layer, the fin starts to cause a ductile deformation. Further, the deposition of the dielectric film 17 and the heat treatment applied thereto contributes to the ductile deformation of the electrode fin. It should be noted that the yielding strength of materials generally decreases at elevated temperatures because of the movement of dislocations which is facilitated in such elevated temperatures.

Further, it was found that the deformation of the electrode fin tends to appear most conspicuously in the electrode fin at the top of the stacked fin capacitor because of the cumulative effect of the thermal stress. It should be noted that there occurs an accumulation of the stress during each deposition of the polysilicon layers and the silicon oxide layers.

SUMMARY OF THE INVENTION

Accordingly, it is a general object of the present invention to provide a novel and useful dynamic random access memory and a fabrication process thereof, wherein the foregoing problems are eliminated.

Another and more specific object of the present invention is to provide a dynamic random access memory having a stacked fin electrode for a memory cell capacitor wherein the deformation of fins forming the stacked fin electrode is successfully eliminated even when the thickness of the fin is reduced for increased storage capacity of the dynamic random access memory.

Another object of the present invention is to provide a process for fabricating a dynamic random access memory comprising the steps of: forming a diffusion region of a first conductivity type in a semiconductor substrate of a second, opposite conductivity type; providing an insulation layer on said semiconductor substrate; forming a contact hole in said insulation layer such that said diffusion region is exposed at said contact hole; depositing a semiconductor layer on an upper major surface of said insulation layer in the amorphous state such that said semiconductor layer establishes an intimate contact with said upper major surface of said insulation layer and further with said exposed diffusion region via said contact hole; patterning said semiconductor layer to form a capacitor electrode such that said capacitor electrode is defined by a side wall and such that said capacitor electrode is in contact with said diffusion region at said contact hole; depositing a dielectric film on said capacitor electrode such that said dielectric film covers an upper major surface of said capacitor electrode and further said exposed side wall; and depositing a semiconductor material to form an opposing electrode such that said opposing electrode buries said capacitor electrode underneath while establishing an intimate contact with said dielectric film that covers said capacitor electrode.

Another object of the present invention is to provide a dynamic random access memory, comprising: a semiconductor substrate doped to a first conductivity type and having upper and lower major surfaces; first and second diffusion regions doped to a second, opposite conductivity type and formed in said substrate with a mutual separation, said first and second diffusion regions forming thereby a channel region therebetween; gate electrode means provided on said upper major surface of said substrate between said first and second diffusion regions for controlling conduction of carriers between said first and second diffusion regions thorough said channel region, said gate electrode means including a gate oxide film provided at said upper major surface of said substrate and a polysilicon strip provided on said gate oxide film as a gate electrode, said polysilicon strip extending over the upper major surface of the substrate as a word line; an insulation layer provided on said upper major surface of said substrate to bury said gate electrode means underneath; a first contact hole provided in said insulation layer for exposing said first diffusion region; a polysilicon bit line provided on said insulation layer to extend over said substrate, said polysilicon bit line being formed in contact with said exposed first diffusion region at said first contact hole; a second contact hole provided in said insulation layer for exposing said second diffusion region; a stacked fin electrode of polysilicon provided in contact with said exposed second diffusion region at said second contact hole, said stacked fin electrode having one or more electrode fins defined by upper and lower major surfaces and a side wall; a dielectric film covering said stacked fin electrode including said upper and lower major surfaces and said side wall; and an opposing electrode of polysilicon provided in intimate contact with said dielectric film such that said dielectric film is sandwiched between said stacked fin electrode and said opposing electrode; said polysilicon forming said stacked fin electrode having a grain size substantially larger than a grain size of said opposing electrode.

According to the present invention, the problem of deformation of the electrode fin is successfully eliminated even when the thickness of the electrode fin is reduced below 100 nm, by forming the stacked fin electrode in the amorphous state. It is believed that the absence of grain boundary in the amorphous silicon suppresses the ductile deformation of the electrode fin successfully. It should be noted that the ductile deformation involves a slip at the grain boundary in polycrystal materials. After the heat treatment applied at the time of depositing the dielectric film, the amorphous electrode fin crystallizes. Thereby, there occurs a significant grain growth in the electrode fin because of the absence of preexisting grains, and a coarse texture characterized by a small number of large grains much larger than the grains forming the opposing electrode, is obtained for the electrode fin. In the opposing electrode, which is deposited as a polycrystalline phase from the beginning, there occurs a competing process in the grain growth between individual crystals and such a competitive grain growth results in a suppressing of the selective growth of small number of crystals. Thus, the dynamic random access memory formed according to the process of the present invention is characterized by a coarse grain texture of the electrode fin as compared with other polysilicon electrodes that are formed from the beginning as the polycrystalline phase. These polysilicon electrodes include the word lines and the bit lines in addition to the foregoing opposing electrode. In addition to the foregoing advantageous feature of the resistance against ductile deformation, the present invention provides another advantageous feature that the electrode fin is formed with a uniform thickness even when the thickness of the fin is reduced below a few nanometers. It is believed that the formation of the island structure, which is pertinent to the growth of polysilicon layer on an insulator layer, is successfully eliminated by growing the fin electrode in the form of amorphous silicon. Thereby, a sufficient capacitance is secured even when the thickness of the electrode fin is reduced to a few nanometers.

Another object of the present invention is to provide a process for fabricating a dynamic random access memory comprising the steps of: forming a diffusion region of a first conductivity type in a semiconductor substrate of a second, opposite conductivity type; depositing an etching stopper layer which is immune to an etching process, on said substrate; depositing consecutively a first semiconductor layer and an insulation layer on said etching stopper layer; forming a contact hole in said insulation layer to penetrate through said semiconductor layer and further through said etching stopper layer such that said diffusion region is exposed at said contact hole; depositing a second semiconductor layer on an upper major surface of said insulation layer such that said semiconductor layer establishes an intimate contact with said upper major surface of said insulation layer and further with said exposed diffusion region via said contact hole; patterning said first and second semiconductor layers together with said insulation layer interposed therebetween to form a capacitor electrode such that said capacitor electrode is defined by a side wall and such that said capacitor electrode is in contact with said diffusion region at said contact hole; removing said insulation layer by an etching process that acts selectively upon said insulation layer; depositing a dielectric film on said capacitor electrode such that said dielectric film covers an exposed surface of said capacitor electrode; and depositing a semiconductor material to form an opposing electrode such that said opposing electrode buries said capacitor electrode underneath while establishing an intimate contact with said dielectric film that covers said capacitor electrode; said step of removing said insulation layer comprises a dry etching process using a vapor mixture of HF and $H_2O$ conducted intermittently in the form of a plurality of etching steps with an intervening drying process interposed between said etching steps, wherein each etching step is interrupted before a gap formed between said first and second semiconductor layers as a result of etching is filled completely by a fluid formed as a result of the etching. According to the present invention, one can reduce the surface tension acting at the electrode fin at the time of etching of the insulation film sandwiched between the electrode fins.

Another object of the present invention is to provide a process for fabricating a dynamic random access memory comprising the steps of: forming a diffusion region of a first conductivity type in a semiconductor substrate of a second, opposite conductivity type; depositing an etching stopper layer which is immune to an etching process, on said substrate; depositing consecutively a first semiconductor layer and an amorphous carbon layer on said etching stopper layer; forming a contact hole in said amorphous carbon layer to penetrate through said semiconductor layer such that said diffusion region is exposed at said contact hole; depositing a second semiconductor layer on an upper major surface of said amorphous carbon layer such that said semiconductor layer establishes an intimate contact with said upper major surface of said amorphous carbon layer and further with said exposed diffusion region via said contact hole; patterning said first and second semiconductor layers together with said amorphous carbon layer interposed therebetween to form a capacitor electrode such that said capacitor electrode is defined by a side wall and such that said capacitor electrode is in contact with said diffusion region at said contact hole; removing said amorphous carbon layer by an etching process conducted under the existence of oxygen; depositing dielectric film on said capacitor electrode such that said dielectric film covers an exposed surface of said capacitor electrode; and depositing a semiconductor material to form an opposing electrode such that said opposing electrode buries said capacitor electrode underneath while establishing an intimate contact with said dielectric film that covers said capacitor electrode. According to the present invention, the problem of the surface tension acting on the surface of the electrode fins at the time of etching of the layer sandwiched by the electrode fins is successfully eliminated by using an amorphous carbon layer and ashing the same in the oxidizing environment.

Another object of the present invention is to provide a dynamic random access memory, comprising: a semiconductor substrate doped to a first conductivity type and having upper and lower major surfaces; first and second diffusion regions doped to a second, opposite conductivity type and formed in said substrate with a mutual separation, said first and second diffusion regions forming thereby a channel region therebetween; gate electrode means provided on said upper major surface of said substrate between said first and second diffusion regions for controlling conduction of carriers between said first and second diffusion regions thorough said channel region, said gate electrode means including a gate oxide film provided at said upper major surface of said substrate and a polysilicon strip provided on said gate oxide film as a gate electrode, said polysilicon strip extending over the upper major surface of the substrate as a word line; an insulation layer provided on said upper major surface of said substrate to bury said gate electrode means underneath; a first contact hole provided in said insulation layer for exposing said first diffusion region; a polysilicon bit line provided on said insulation layer to extend over said substrate, said polysilicon bit line being formed in contact with said exposed first diffusion region at said first contact hole; a second contact hole provided in said insulation layer for exposing said second diffusion region; a stacked fin electrode of polysilicon provided in contact with said exposed second diffusion region at said second contact hole, said stacked fin electrode having a plurality of electrode fins each defined by upper and lower major surfaces and a side wall; a dielectric film covering said stacked fin electrode including said upper and lower major surfaces and said side wall of said electrode fins; and an opposing electrode of polysilicon provided in intimate contact with said dielectric film such that said dielectric film is sandwiched between said stacked fin electrode and said opposing electrode; each of said electrode fins forming said stacked fin capacitor having a thickness that is different from other electrode fins such that an electrode fin has a larger thickness as compared with the electrode fins located at a lower level. According to the present invention, one can eliminate the problem of deformation of the electrode fin forming the stacked fin electrode by increasing the thickness of the fins that experience a large thermal stress selectively as compared with other electrode fins.

Other objects and further features of the present invention will become apparent from the following detailed description when read in conjunction with the attached drawings.

BRIEF DESCRIPTION OF THE DRAWINGS

FIGS. 1(A)–1(F) are diagrams showing the conventional process for fabricating a dynamic random access memory that has a stacked fin memory cell capacitor;

DETAILED DESCRIPTION OF THE PREFERRED EMBODIMENTS

In order to understand the mechanism of deformation of the electrode fins of the stacked fin capacitor, the inventor of the present invention has conducted a series of experiments.

Figure 3:
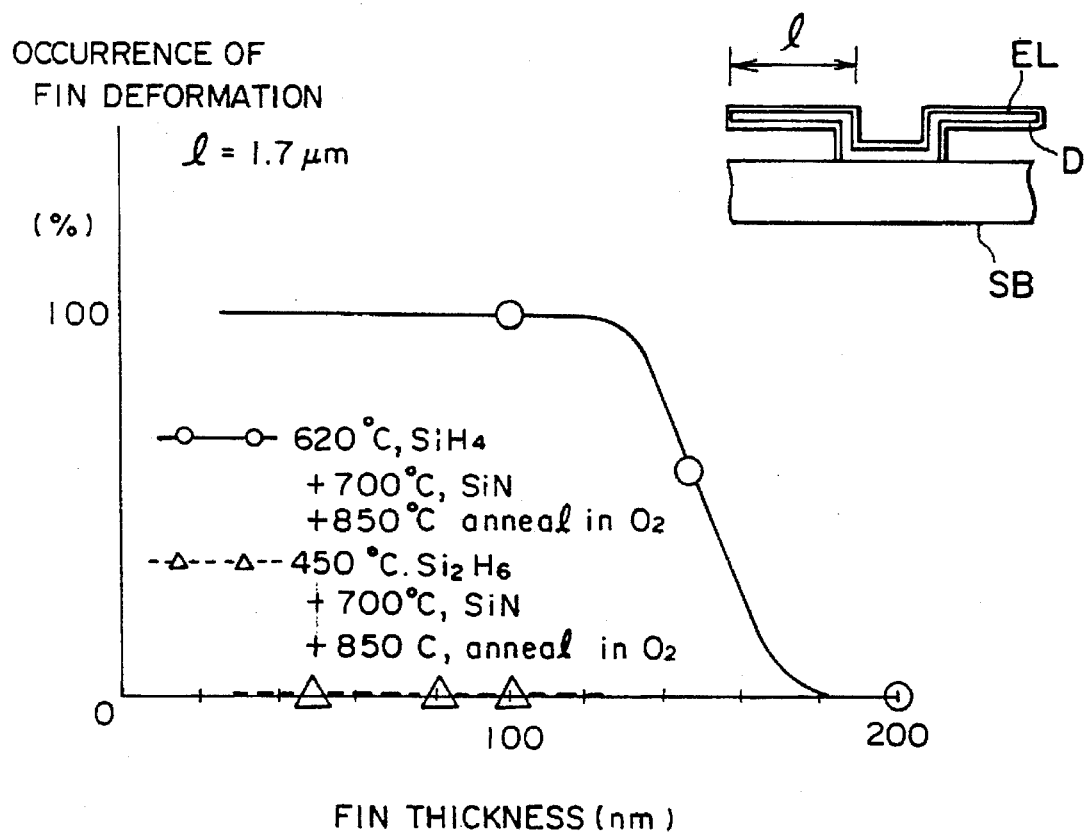
FIG. 3 is a diagram showing the frequency of occurrence of the deformation of the electrode fin as a function of the fin thickness for two different deposition conductions, one for depositing the electrode fin as a polycrystal phase and the other for depositing the electrode fin as an amorphous phase.

FIG. 3 shows the result of the experiments conducted for investigating the effect of the deposition temperature of the stacked fin electrode, on the occurrence of the deformation of the electrode fin, wherein FIG. 3 shows the result in the form of a graph describing the percentage of deformation occurrence and the fin thickness.

In the present investigation, a model device shown in FIG. 3 is used for the experiment, with a fin-shaped electrode EL having a lateral size 1 set to 1.7 μm. The device is fabricated by the steps similar to the process of FIGS. 1(A)–1(F). More specifically, the device is formed by depositing a silicon oxide layer (not shown) on a silicon substrate SB by a CVD process, forming a contact hole (not shown) on the silicon oxide layer, depositing a silicon layer on the silicon oxide layer by a CVD process and patterning the same to form the fin-shaped electrode EL in contact with the substrate at the contact hole, and removing the silicon oxide layer by a wet etching process. Further, a silicon nitride film D is deposited on the surface of the electrode EL by a CVD process at 700° C., and the structure thus formed is subjected to a thermal oxidation process at 850° C. for eliminating pin holes formed in the silicon nitride film D.

The experiment was conducted in two series with respective CVD temperatures for the deposition of the silicon electrode EL. In the first series, the deposition of the electrode EL was achieved at 620° C., while in the second series, the temperature was set at 450° C. When depositing silicon at 620° C., monosilane ($SiH_4$) was used for the source of silicon similarly to the conventional case. When depositing the silicon electrode EL at 450° C., on the other hand, disilane ($Si_2H_6$) was used for facilitating the deposition, with an optimum flowrate of 40 cc/min. The disilane gas used for the source of Si may be supplied of course with the usual He carrier gas. However, it was found that a more uniform thickness is obtained when the disilane gas alone is used. During the deposition, the pressure inside the reaction vessel was set at about 0.5 Torr. Thereby, a deposition rate of about 1.5 nm/min was obtained. It should be noted that, when the deposition is made at 620° C., the silicon layer that forms the fin-shaped electrode EL is deposited as polysilicon. On the other hand, the silicon layer is deposited as an amorphous phase when the deposition is achieved at 450° C.

Figure 2:
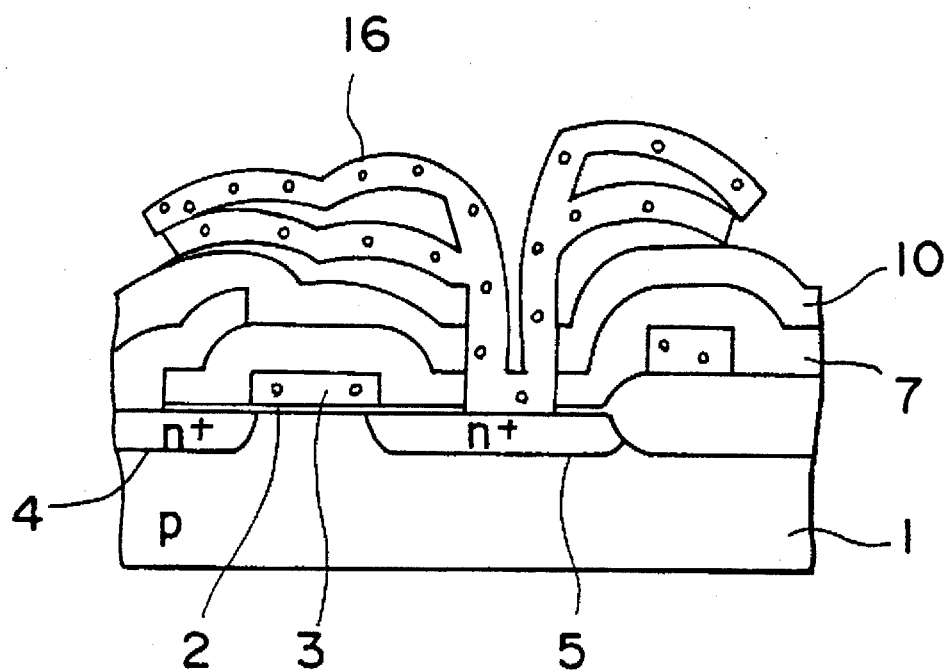
FIG. 2 is a diagram showing the deformation of the electrode fin occurring in the conventional fabrication process of a dynamic random access memory.

As can be seen clearly, the occurrence of deformation of the fin-shaped electrode is almost eliminated when the deposition temperature is set at 450° C., even when the thickness of the electrode fin is reduced below 100 nm. In fact, no noticeable deformation was observed even when the thickness of the fin is reduced to about 20 nm as indicated by the broken line. On the other hand, those samples that employed the deposition temperature of 620° C. showed the deformation occurring when the thickness of the fin is reduced below about 100 nm. Generally, it was found that the stacked fin electrodes provided on a smooth surface as the model device of FIG. 3 experience less deformation as compared with the device of FIG. 2 wherein the stacked fin electrode is provided on a non-flat surface. Although the reason of this difference is not fully explored, it is thought probable that the absence of grain boundary in the amorphous silicon material prevents the ductile deformation of the amorphous silicon electrode EL. The result of FIG. 3 encourages the use of low deposition temperature for the formation of the stacked fin capacitor.

Figure 4:
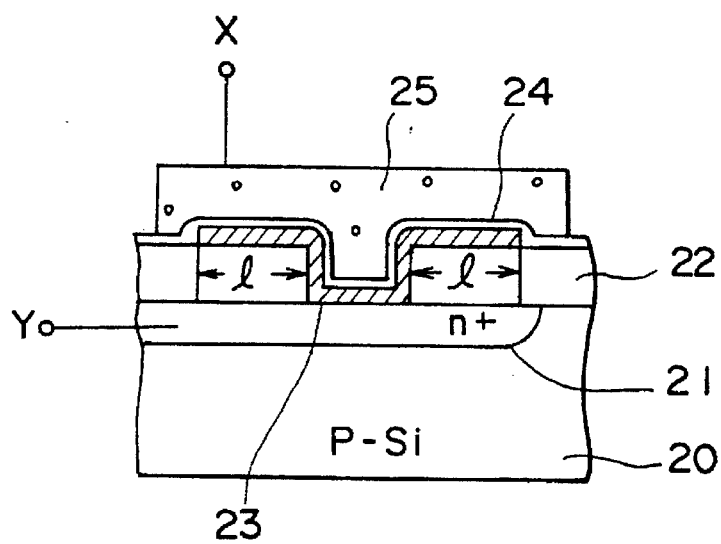
FIG. 4 is a diagram showing the cross section of a device used for the experiment to investigate the relationship between the capacitance of the memory cell capacitor and the condition of deposition of an electrode that forms the capacitor.
Figure 5:
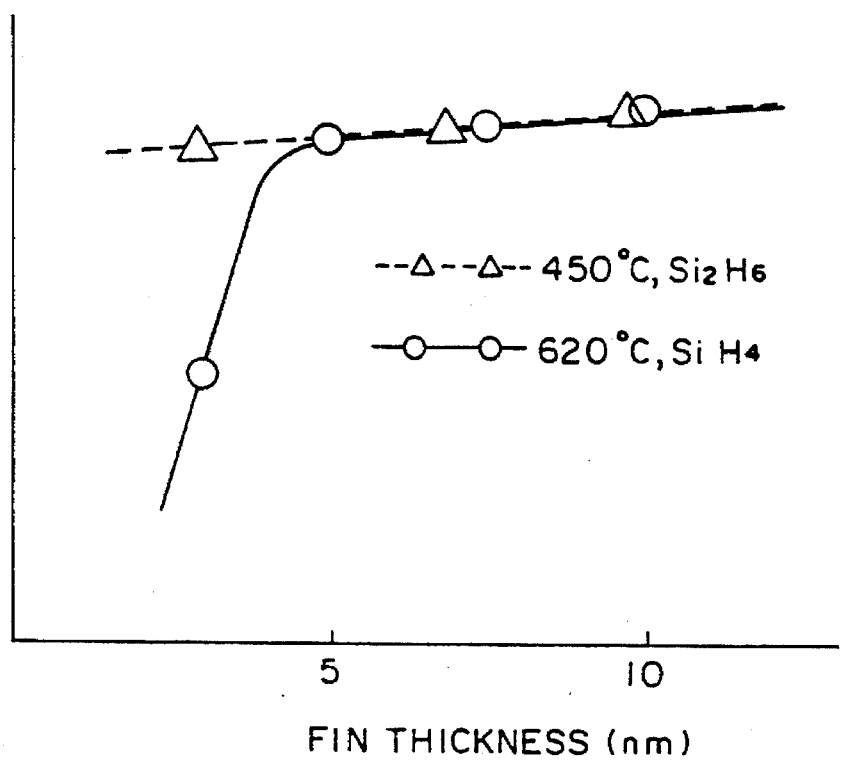
FIG. 5 is a diagram showing the relationship obtained by the experiment that uses the device of FIG. 4.

In order to investigate the feasibility of the low temperature deposition for forming the stacked fin capacitor, the inventor of the present invention has conducted experiments to measure the capacitance of the stacked fin capacitor while reducing the thickness of the electrode fin. FIGS. 4 and 5 show the investigation, wherein FIG. 4 shows the structure of the specimen used for the investigation and FIG. 5 shows the result.

Referring to FIG. 4, the device used for the investigation is constructed on a p-type silicon substrate 20 and includes an $n^+$-type diffusion region 21 that is formed at the surface of the substrate 20. The surface of the substrate 20 is covered by a silicon oxide film 22 having a thickness of 100 nm, and a contact hole is formed in the silicon oxide film 22 such that the diffusion region 21 is exposed. On the surface of the silicon oxide film 22, an electrode 23 of silicon is formed such that the electrode 23 establishes a contact with the exposed diffusion region 21, wherein the thickness of the electrode 23 is changed variously in the experiment. The electrode 23 is covered by a silicon nitride film 24 having a thickness of 6 nm, and a polysilicon electrode 25 is deposited to bury the electrode 23 together with the dielectric film 24 covering the electrode 23.

In the present investigation, two series of experiments were conducted similarly to the investigation explained with reference to FIG. 3, one having the electrode 23 deposited in the form of amorphous silicon and the other having the electrode 23 deposited in the form of polysilicon. Similarly to the investigation of FIG. 3, the amorphous silicon electrode was formed by the CVD process of disilane conducted at 450° C., while the polysilicon electrode was formed by the CVD process of monosilane at 620° C. In each experiment, the capacitance across the diffusion region 21 and the polysilicon electrode 25 was measured.

As shown in FIG. 5 showing the result of the investigation, it was clearly demonstrated that a sufficient capacitance is secured even when the thickness of the electrode fin is reduced below about 5 nm when the electrode is formed as amorphous silicon. On the other hand, when the electrode is formed as polysilicon, the capacitance decreases rapidly when the thickness of the electrode fin is reduced below 5 nm. It is believed that the polysilicon forming the electrode fin forms an island structure on the silicon oxide film 22 upon deposition. In such an island structure, the isolated islands of polysilicon are not connected to the diffusion region 21 electrically and do not contribute to the capacitance of the memory cell capacitor. On the other hand, it is believed that the amorphous silicon deposited at low temperatures such as 450° C. covers the surface of the silicon oxide film 22 uniformly and a sufficient capacitance is secured to a result of the uniform coverage. The gradual decrease of the capacitance shown in FIG. 5 for both the amorphous electrode and the polysilicon electrode is believed to be caused by the decrease of the thickness and hence the side wall area of the electrode. The result of FIG. 5 clearly indicates the advantage of using amorphous silicon for the stacked fin electrode.

Further, the inventor of the present invention has conducted an investigation concerning the effect of the heat treatment applied to the dielectric film on the occurrence of the fin deformation. It should be noted that the silicon nitride film such as the film 17 of FIG. 1(E) is formed by the CVD process that is conducted at a high temperature such as 700° C. Thereby, there can occur a large thermal stress at the interface between the film 17 and the electrode fin of the stacked fin electrode 16 because of the difference in the thermal expansion between the silicon electrode 16 and the silicon nitride film 17. Further, it should be noted that a thermal oxidation process is applied to the silicon nitride film 17 in order to eliminate short circuit of the capacitor via minute pin holes formed in the thin silicon nitride film. Such a thermal oxidation process also may be responsible for the deformation of the electrode fin.

Figure 6:
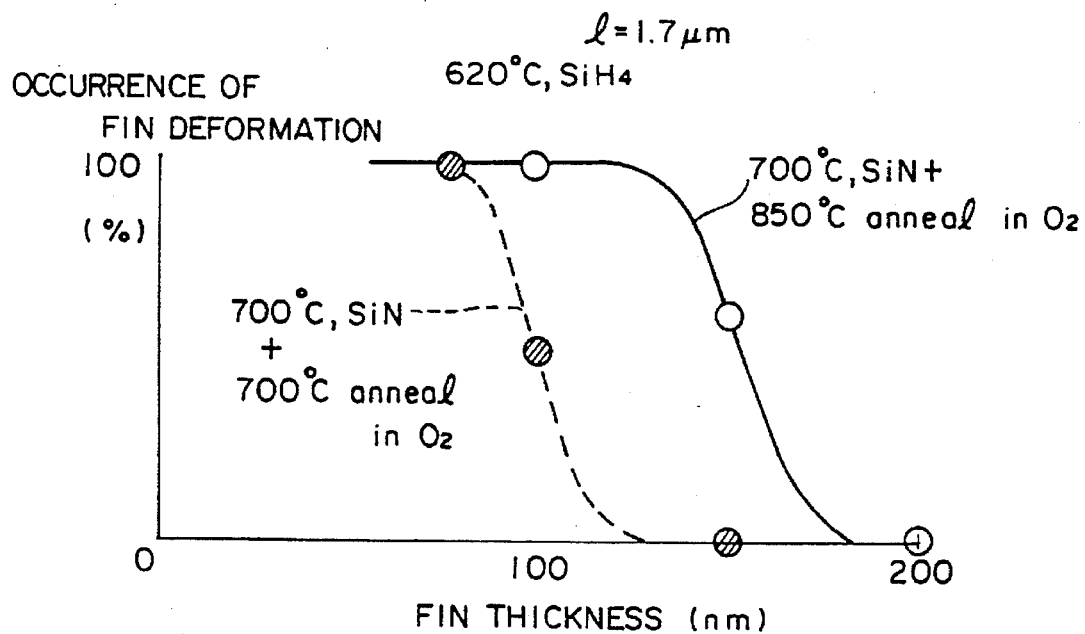
FIG. 6 is a diagram showing the frequency of occurrence of the deformation in the electrode fin as a function of the fin thickness for various heat treatment processes applied to a dielectric film that forms the memory cell capacitor.

Referring to FIG. 6 showing the result of the investigation, the vertical axis represents the percentage of occurrence of the deformation and the horizontal axis represents the thickness of the fin. In the experiment of FIG. 6, a fin capacitor as shown in the same diagram is used with a fin size 1 set to 1.7 μm. The electrode of the fin capacitor is formed by depositing a polysilicon by a CVD process that uses a thermal decomposition of silane ($SiH_4$) at 620° C. The formation of the stacked fin electrode is achieved by the process similar to the process described with reference to FIG. 3 and the description will not be repeated.

In FIG. 6, it should be noted that the continuous line represents the relationship of the specimen that has the stacked fin capacitor which is covered by a silicon nitride film deposited by a CVD process at 700° C. and oxidized subsequently at 850° C., while the broken line represents the relationship for the specimen that has the stacked fin capacitor which is oxidized at 700° C. after the deposition of silicon nitride at 700° C. In both experiments, it was shown that the deformation of the electrode fin is inevitable when the thickness of the fin is reduced below about 100 nm as long as the electrode fin is formed of polysilicon. The difference between the continuous line and the broken line is believed to reflect the effect of the thermal stress formed at the boundary between the fin and the silicon nitride film.

Figure 7:
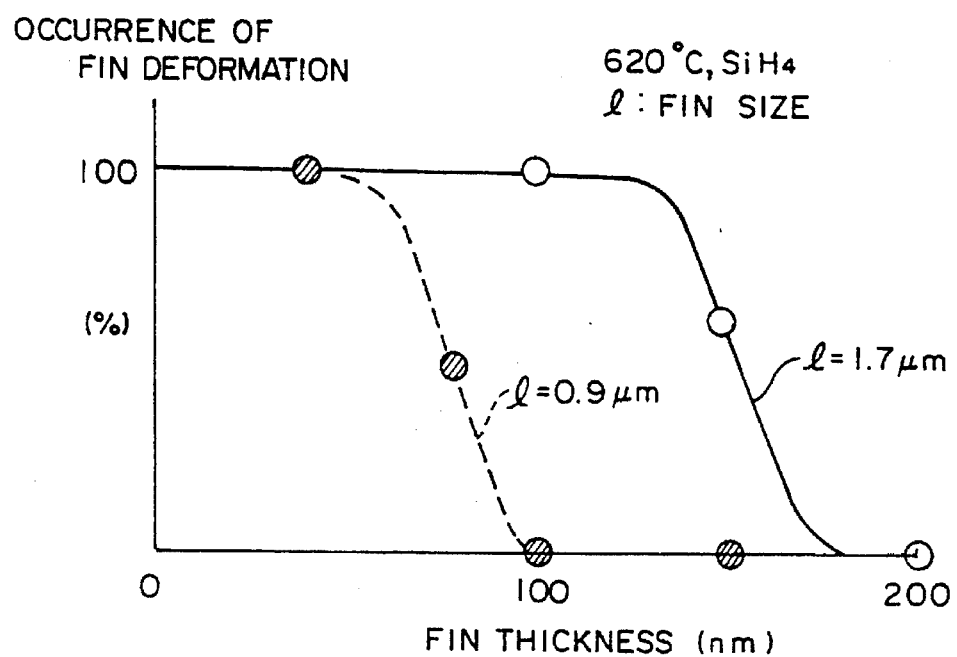
FIG. 7 is a diagram showing the frequency of occurrence of the deformation of the electrode fin as a function of the fin thickness for various lateral sizes of the electrode fin.

FIG. 7 shows the effect of the lateral size 1 on the occurrence of the fin deformation. Again, the stacked fin capacitor is formed by polysilicon deposited by the CVD process of silane conducted at 620° C. The relationship of FIG. 4 indicates that the occurrence of deformation decreases when the size 1 and hence the surface area of the electrode fin is decreased. This result suggests that the deformation is caused by the thermal stress acting at the interface between the polysilicon electrode fin and the silicon nitride film that covers the electrode fin. Again, it will be seen that the deformation occurs more or less when the thickness of the electrode fin is reduced below about 100 nm even when the size 1 is reduced, as long as the fin electrode is formed of polysilicon.

Figure 8:
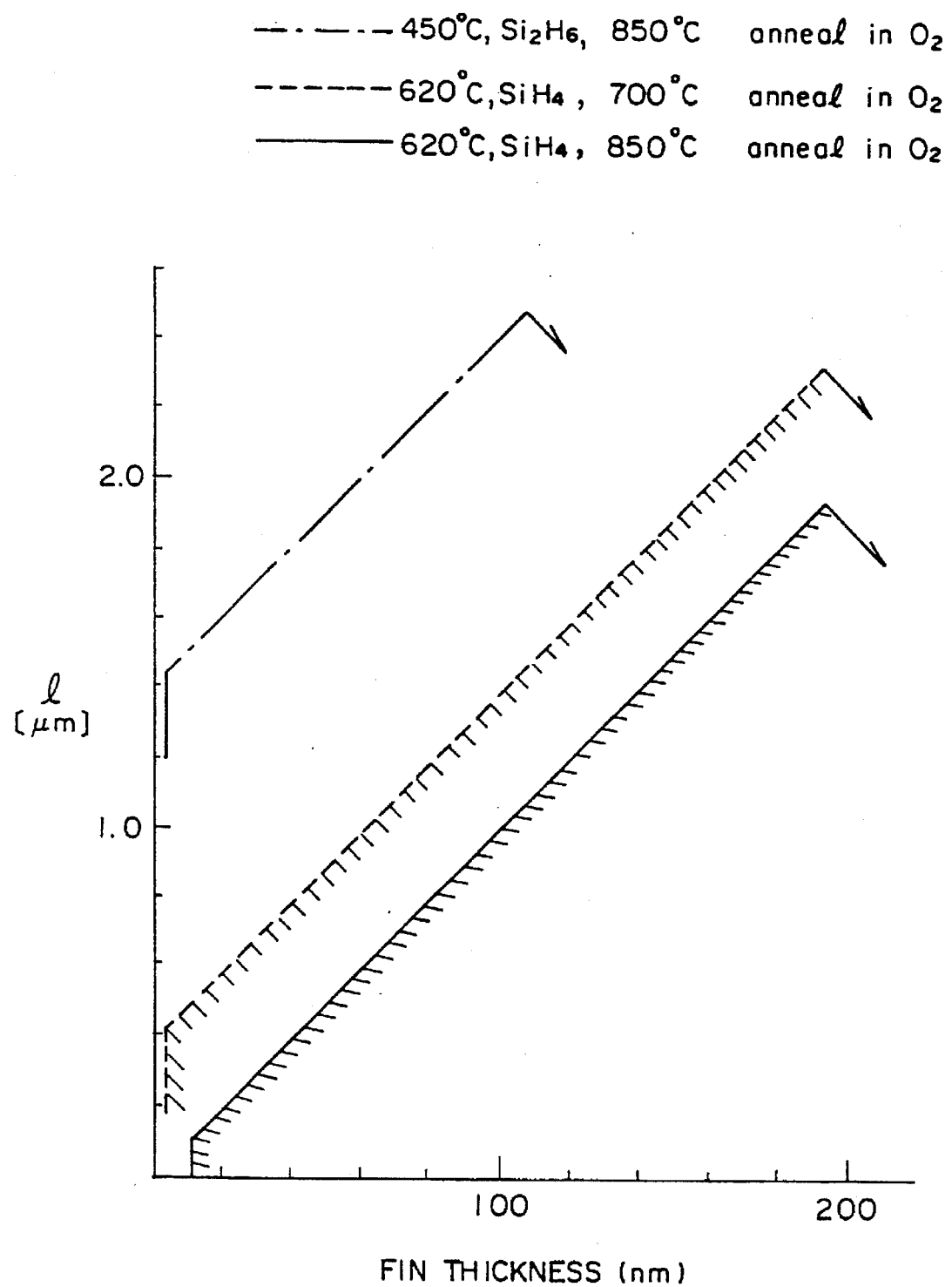
FIG. 8 is a diagram showing the optimum range of the lateral size and thickness for the electrode fin that provides a successful suppressing of the fin deformation and simultaneously a sufficient capacitance as a memory cell capacitor.

FIG. 8 summarizes the foregoing findings and shows an optimum range of the fin length and the fin thickness in which the stacked fin capacitor can be fabricated without substantial deformation of the electrode fin.

As shown in FIG. 8, the boundary representing the allowable thickness of the electrode fin decreases with decreasing lateral size 1, reflecting the general relationship shown in FIG. 3 and FIGS. 5–7, wherein the position of the boundary changes with the depositing condition as well as with the processing condition of the electrode fin. In FIG. 8, it should be noted that the region located at the lower right side of the boundary line represents the region wherein the deformation of the electrode fin does not occur.

In FIG. 8, the boundary represented by the continuous line indicates the case wherein the stacked fin electrode is deposited by the CVD process of monosilane at 620° C. and annealed at 850° C. in the oxidizing atmosphere after the formation of the silicon nitride film. On the other hand, the boundary represented by the broken line represents the case wherein the stacked fin electrode is deposited by the CVD process of monosilane also at 620° C. and annealed for oxidation at a lower temperature of 700° C. Future, the boundary represented by the one-dotted chain represents the case wherein the stacked fin electrode is deposited by the CVD process of disilane at 450° C. and annealed at 850° C. for oxidation. From this diagram, it will be understood that one can avoid the occurrence of the deformation of the electrode fin successfully even when the electrode fin has a large lateral size 1, by forming the stacked fin capacitor by the CVD process conducted at low temperatures such that the stacked fin electrode is deposited in the form of amorphous silicon.

Next, a first embodiment of the present invention will be described with reference to FIGS. 9(A)–9(H).

Figure 9A:
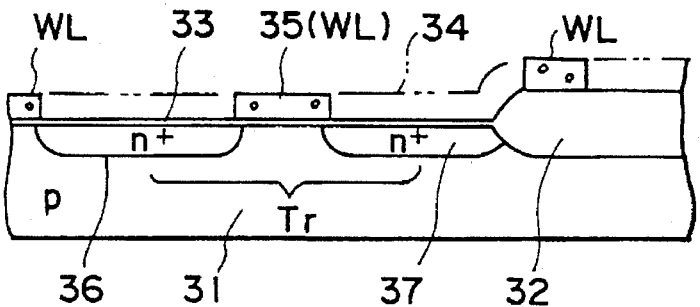
FIGS. 9(A)–9(H) are diagrams showing the fabrication process of a dynamic random access memory according to a first embodiment of the present invention.

Referring to FIG. 9(A), a p-type silicon substrate 31 corresponding to the substrate 1 of FIG. 1(A) is covered by a thick field oxide film 32 of silicon oxide that corresponds to the field oxide region 1a of FIG. 1(A) as well as by a thin silicon oxide film 33 that corresponds to the silicon oxide film 2 of FIG. 1(A). Typically, the field oxide film 32 has a thickness of about 400 nm while the silicon oxide film 33 has a thickness of about 10 nm. On the surface of the substrate 31 thus covered by the field oxide film 32 and the silicon oxide film 33, a plurality of polysilicon word lines WL are provided to extend generally parallel with each other, wherein the part of the polysilicon word line WL that extends over the silicon oxide film 33 acts as a gate electrode 35 of a transfer gate transistor. Thereby, the silicon oxide film 33 under the gate electrode 35 acts as a gate oxide film.

Typically, the polysilicon word line WL is formed by the steps of: depositing a polysilicon layer with a thickness of about 200 nm; incorporating phosphorus ions with a concentration level of about $1\times10^{20}/cm^3$ to increase the conductivity; and patterning the polysilicon layer. Further, $n^+$-type diffusion regions 36 and 37 are formed at both lateral sides of the gate electrode 35 respectively as the source and drain of the transfer gate transistor by the ion implantation process conducted by using the electrode 35 as a mask, similarly to the conventional device. Typically, the phosphorus ions are incorporated with a dose of about $3\times10^{13}/cm^3$. Thereby, there is formed a transfer gate transistor Tr having the diffusion region 36 as the source, the diffusion region 37 as the drain, and the polysilicon gate electrode 35 connected to the word line WL.

On the surface of the structure of FIG. 1(A), a silicon oxide film 38 is provided by a CVD process as shown in FIG. 1(B) with a thickness of about 100 nm as usual, and a contact hole 39 is provided through the layer 38 as well as through the layer 33 located underneath the layer 38 such that the surface of the diffusion region 36 is exposed at the contact hole 39. Further, a polysilicon layer 40 and a tungsten silicide layer 11 are deposited consecutively on the surface of the silicon oxide film 38 with respective thicknesses of 50 nm and 100 nm such that the layers 10 and 11 establish an electrical contact with the exposed upper major surface of the diffusion region 36. After the deposition of the layers 10 and 11, phosphorus ions are incorporated into the polysilicon layer 10 with an acceleration energy of 70 keV and a dose of $4\times10^{15}/cm^3$ such that the polysilicon layer becomes conductive, and the layers 10 and 11 are patterned to form a bit line BL such that the bit line BL establishes a contact with the diffusion region 36 and acts as a source electrode 42 of the transfer gate transistor Tr. See FIG. 9(B).

Figure 9B:
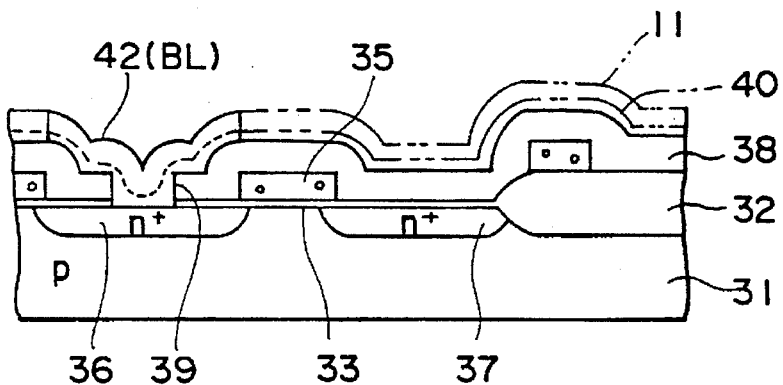

On the structure of FIG. 9(B), a silicon nitride etching stopper 43 is formed with a thickness of 50 nm by a CVD process, and a silicon oxide layer 44 and an amorphous silicon layer 45 are deposited consecutively on the silicon nitride etching stopper 43 by a CVD process with respective thicknesses of 30 nm and 20 nm. Preferably, the amorphous silicon layer 45 is deposited from disilane at the temperature of 400°–550° C., more preferably at the temperature of 450° C. as described previously with reference to FIG. 3. However, it should be noted that the gaseous source for the deposition of amorphous silicon is not limited to disilane but monosilane can also be used though with a reduced deposition rate. Further, one may use trisilane ($Si_3H_8$) for the same purpose. In this case, one can conduct the deposition in the temperature range of 150° C.–500° C. Generally, an amorphous silicon layer is obtained when the CVD process is achieved at the temperature below 500° C.

Figure 9C:
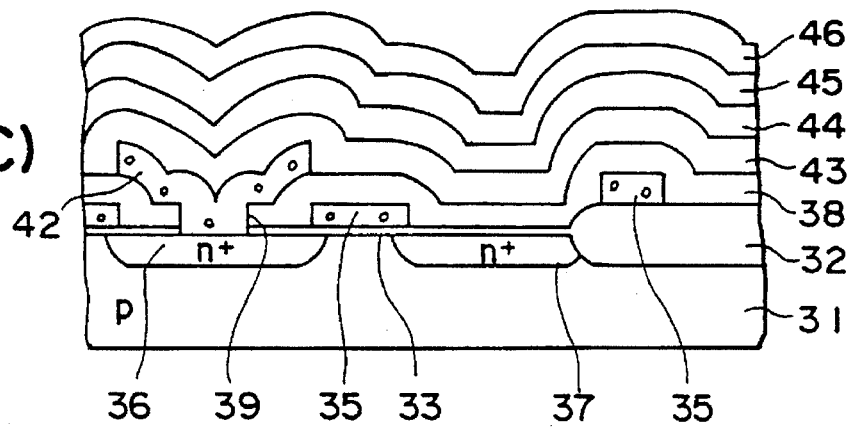

After the deposition of the amorphous silicon layer 45, an ion implantation process of phosphorus is conducted with an acceleration energy of 5 keV and a dose of $4\times10^{15}/cm^3$, and another silicon oxide layer 46 is deposited on the amorphous silicon layer 45 by a CVD process with a thickness of 30 nm. Thereby, a structure shown in FIG. 9(C) is obtained. In order to reduce the thermal stress occurring at the interface between the amorphous silicon layer 45 and the silicon oxide layer 44, one may apply an annealing process for example at 600°–700° C. for 30–180 minutes, after the ion implantation process.

Figure 9D:
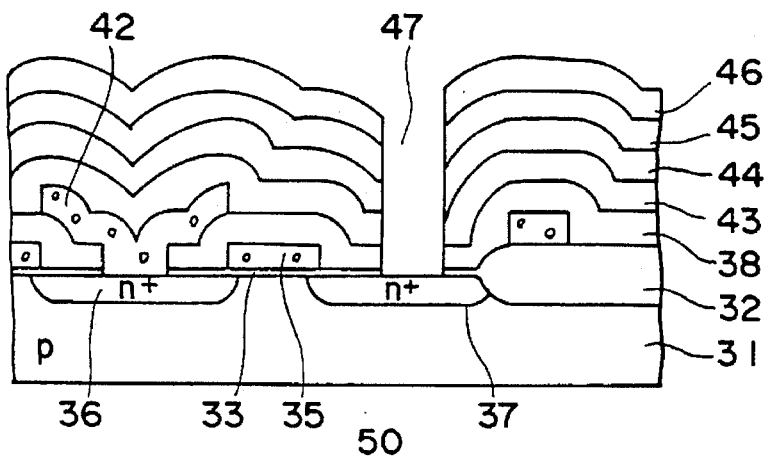

Next, in the step of FIG. 9(D), a photolithographic patterning is conducted to form a contact hole 47 by an RIE process such that the contact hole 47 exposes the upper major surface of the diffusion region 37 by extending through the layers 31, 38 and 43–46.

After the contact hole 47 is formed as shown in FIG. 9(D), an amorphous silicon layer 48 is deposited by a CVD process of disilane conducted at 450° C. such that the amorphous silicon layer 48 covers the side wall as well as the surface of the diffusion region 37 exposed at the bottom of the contact hole 47, and an ion implantation is conducted to incorporate phosphorus ions for rendering the amorphous silicon layer 48 conductive. Next, the layers 45, 46 and 48 are patterned by a photolithographic process that uses an RIE process such that a groove 49 is formed to define a stacked fin electrode 50 laterally as shown in FIG. 9(E).

Figure 9E:
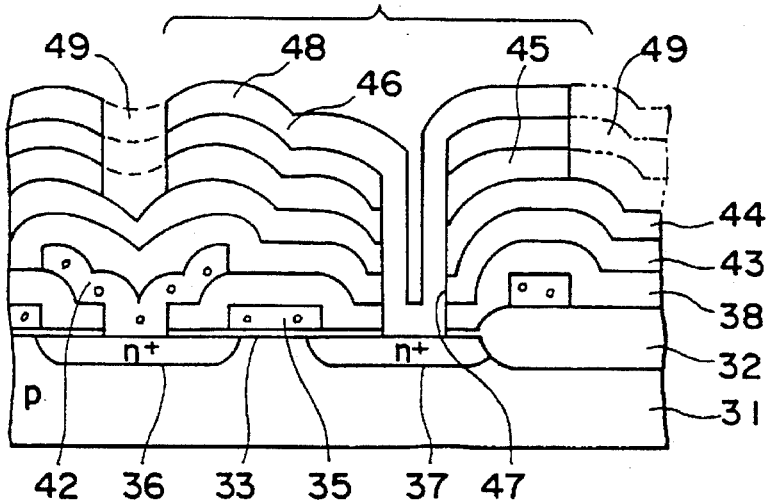
Figure 9F:
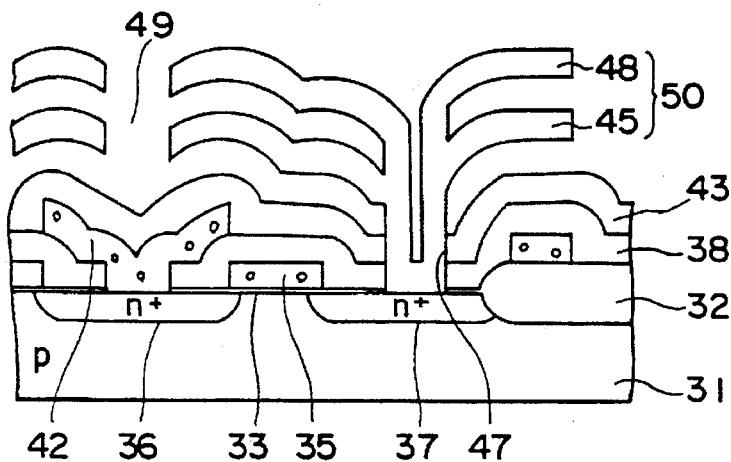

Next, the structure of FIG. 9(E) is subjected to a wet etching process for selectively removing the silicon oxide layers 44 and 49 with respect to the amorphous silicon layers 44 and 48. Thereby, it will be seen in FIG. 9(F) that the amorphous silicon layers 45 and 48 form the electrode fin of the stacked fin electrode 50. As the layers 45 and 48 are formed in the state of amorphous silicon, the ductile deformation of the electrode fin does not occur even when the silicon oxide layer is removed by etching.

Figure 9G:
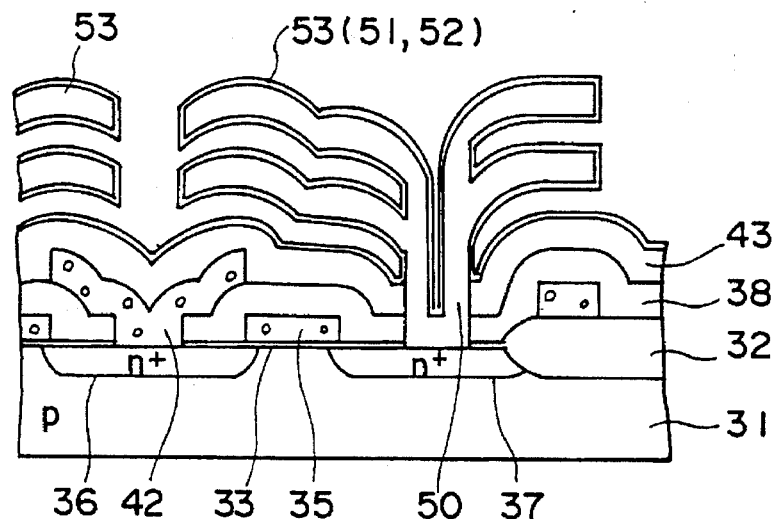

In the step of FIG. 9(G), a silicon nitride film 51 is deposited on the exposed surface of the stacked fin electrode 50 by a CVD process conducted at 800° C. with a thickness of about 7 nm, and the stacked fin electrode 50 thus covered by the silicon nitride film 51 is subjected to a thermal oxidation process conducted at about 800° C. in a wet $O_2$ environment. Thereby, there is formed a silicon oxide film 52 covering the surface of the silicon nitride film 51 with a thickness of about 1 nm for eliminating the leak current caused by a pin hole formed in the silicon nitride film 51. Thereby, the silicon nitride film 51 and the silicon oxide film 52 form together a dielectric film 53 of the memory cell capacitor.

Figure 9H:
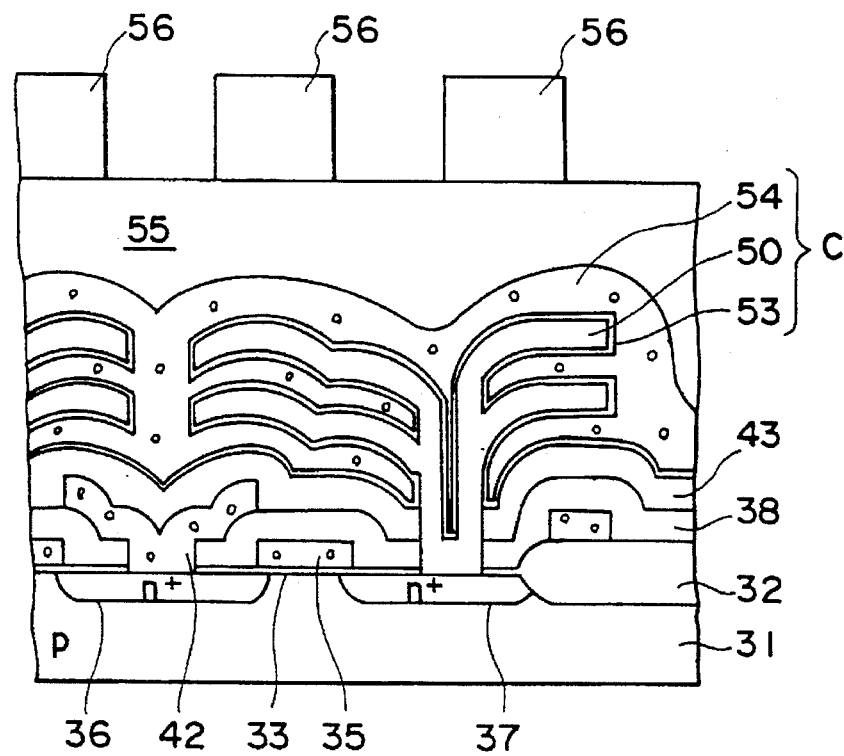

After the dielectric film 53 is formed as sown in FIG. 9(G), a deposition of polysilicon is conducted to form an opposing electrode 54 of polysilicon such that the electrode 54 buries the stacked fin electrode 50 as shown in FIG. 9(H). There, the electrode 54 fills the gap formed between the electrode fins as usual in the stacked fin capacitor. Further, a gas phase thermal diffusion process with $POCl_3$ as the source gas is applied to the electrode 54 at 800° C. for rendering the electrode 54 conductive. Finally, a planarizing insulation layer 55 of BPSG is provided on the electrode 54, and an interconnection conductor 56 such as the shunt word line is provided on the planarized surface of the insulation layer 55. Thereby, the fabrication of the dynamic random access memory is completed.

Figure 10:
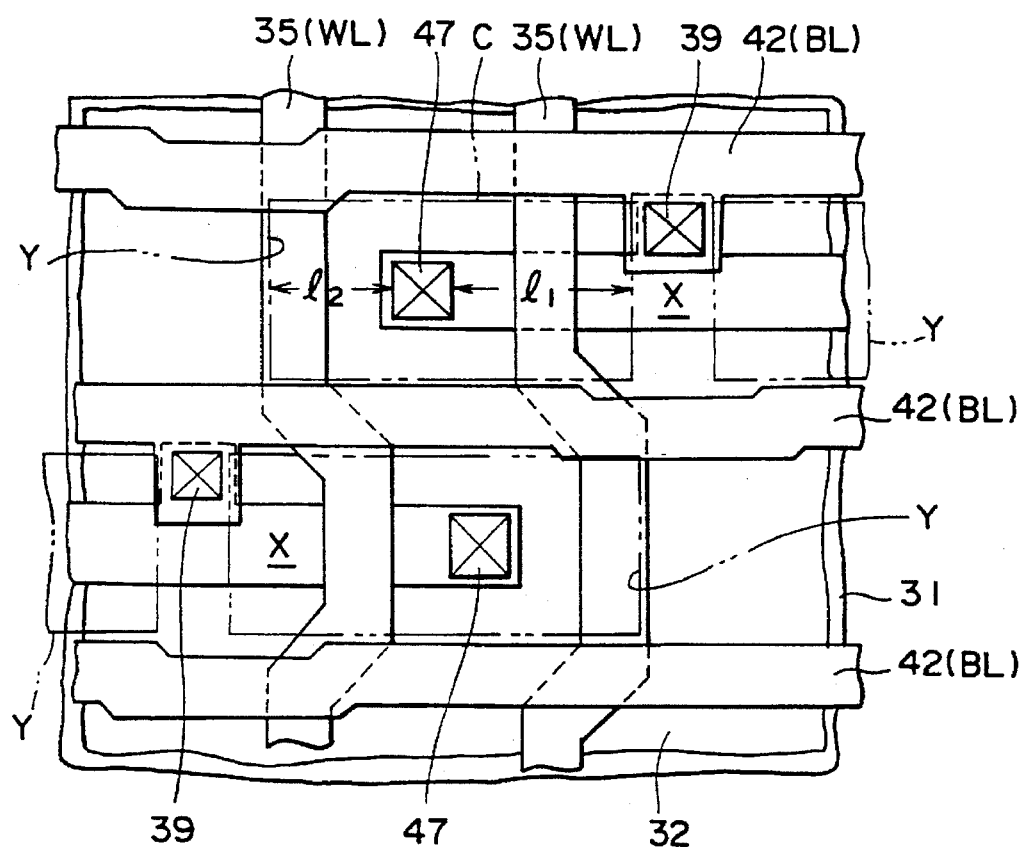
FIG. 10 is a diagram showing the dynamic random access memory of the present invention in a plan view.

FIG. 10 shows the dynamic random access memory thus fabricated in the plan view.

Referring to FIG. 10, there is formed a device region X having an elongated rectangular shape in correspondence to the device region surrounded by the field oxide film 32 of FIG. 9(A), and the contact hole 39 is formed in correspondence to the device region X. Further, the bit lines BL of polysilicon are provided to extend generally parallel with each other in the lateral direction in the drawing, with an electrical connection with the diffusion region 36 at the contact hole 39. Further, the other contact hole 47 is provided in the device region X to expose the diffusion region 37, and the stacked fin capacitor C, defined by a lateral boundary Y, is provided in contact with the diffusion region 37 at the contact hole 47. Between the contact holes 39 and 47, the polysilicon word lines WL extend generally parallel with each other in the vertical direction as illustrated in FIG. 10. In the illustrated example, the contact hole 47 is provided with a lateral offset from the center of the stacked fin capacitor C such that the stacked fin capacitor C has a first lateral size $l_1$ at one side of the contact hole 47 and a second, different lateral size $l_2$ at the other side of the contact hole 47.

Figure 11:
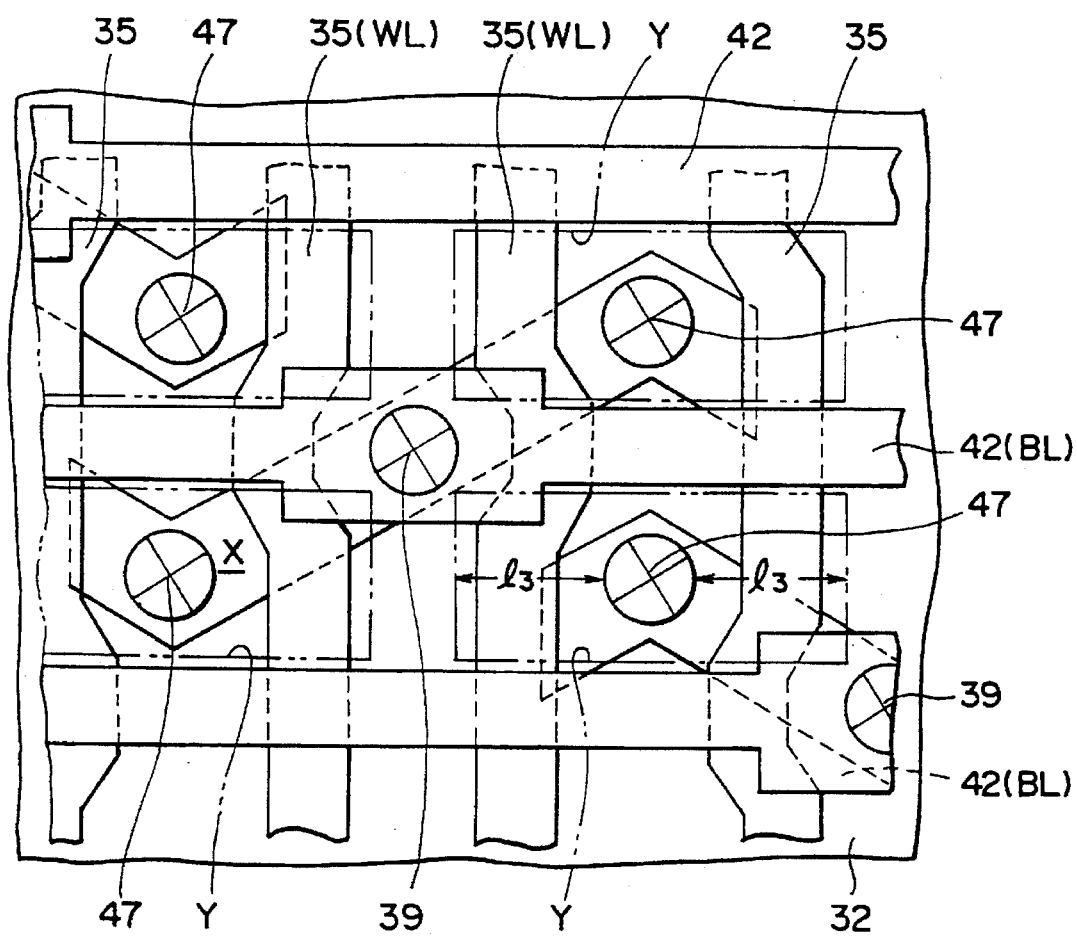
FIG. 11 is a diagram similar to FIG. 10 showing another layout of the dynamic random access memory fabricated according to the process of the first embodiment.

FIG. 11 shows another example of the layout of the dynamic random access memory in the plan view. In the present example, the contact hole 39 is provided at the center of the device region X that is formed to have an elongated rectangular shape extending obliquely in the drawing. In correspondence to the contact hole 39, the bit line BL is provided in contact with the diffusion region 36 and to extend laterally in the drawing, while the word lines extend generally vertically at both sides of the contact hole 39. Further, the contact holes 47 are formed at both ends of the device region X, and the stacked fin capacitor C is provided in contact with the diffusion region 37 at each contact hole 47. In the present structure, the contact hole 47 is located at the center of the capacitor and thus, the length $l_3$ of the fin becomes smaller than the case of FIG. 10. It should be noted that the layout shown in the plan view of FIG. 10 or FIG. 11 is already known and further description will be omitted.

In the dynamic random access memory fabricated according to the process described heretofore, it should be noted that the stacked fin electrode 50 experiences a crystallization upon the heat treatment associated with the CVD process of the silicon nitride film 51 and the thermal oxidation process of the silicon oxide film 52. When the electrode 50 crystallizes, it was found that there occurs a significant crystal growth in the electrode 50, resulting in a coarse grain texture characterized by the grain size which is much larger than the grain size of the polysilicon word lines WL or bit lines BL that are formed from the beginning as a polycrystalline phase.

Figure 19:
FIG. 19 is a photograph showing the texture of a stacked fin electode depoisted in the form of plysilicon.
Figure 20:
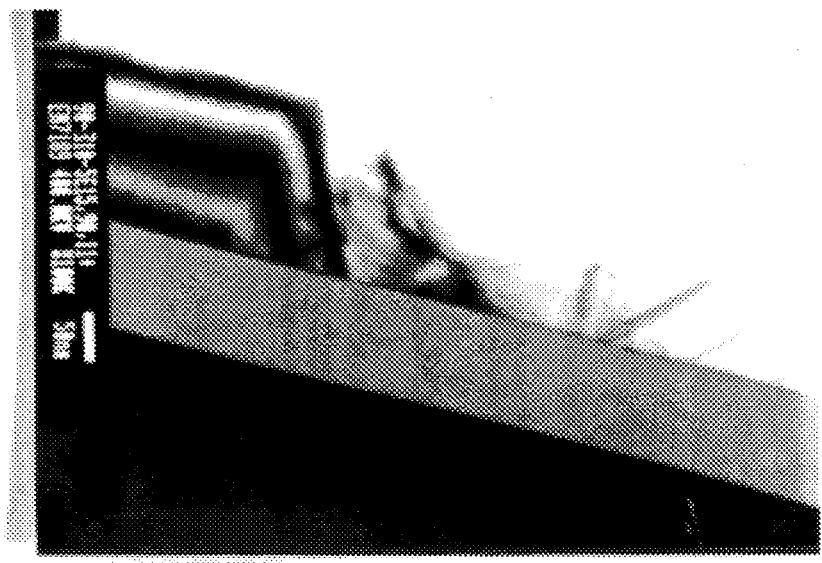
FIG. 20 is a photograph showing the texture of a stacked fin electrode deposited in the form of amorphous silicon and crystallized subsequently.

FIG. 19 shows the cross section of a polysilicon layer grown from monosilane at 620° C., the grain size of the polysilicon layer is in the order of 0.2–0.3 μm even after the heat treatment conducted at about 800° C. In FIG. 19, the dark patterns show the individual grains of silicon crystal forming the polysilicon layer. On the other hand, FIG. 20 shows the cross section of an amorphous silicon layer which was grown at 450° C. from disilane. In FIG. 20, showing the cross section in the same scale as in FIG. 19, it will be noted that there exists a single boundary separating two large crystal grains. These photographs clearly demonstrate the coarse texture of the stacked fin electrode 50 as compared with polysilicon electrodes such as the word line WL, bit line BL or the opposing electrode 54.

It should be noted that the word lines WL and the bit lines BL experience the heat treatment upon the formation of the dielectric film 53. Thereby, the crystal growth occurs also in these polycrystal electrodes. However, because of a competing process occurring in the grain growth between individual crystal grains in the polysilicon electrode, the growth of particular crystal is suppressed or obstructed. In the amorphous silicon electrode 50, on the other hand, the crystallization starting from a small number of nucleation sites can lead to a substantially unobstructed crystal growth, which eventually leads to a very coarse texture for the electrode 50. In fact, the grain size of the stacked fin electrode 50 is generally larger than the grain size of any of the word lines WL, bit lines BL and the opposing electrode 54 by at least about 500 nm.

Figure 12:
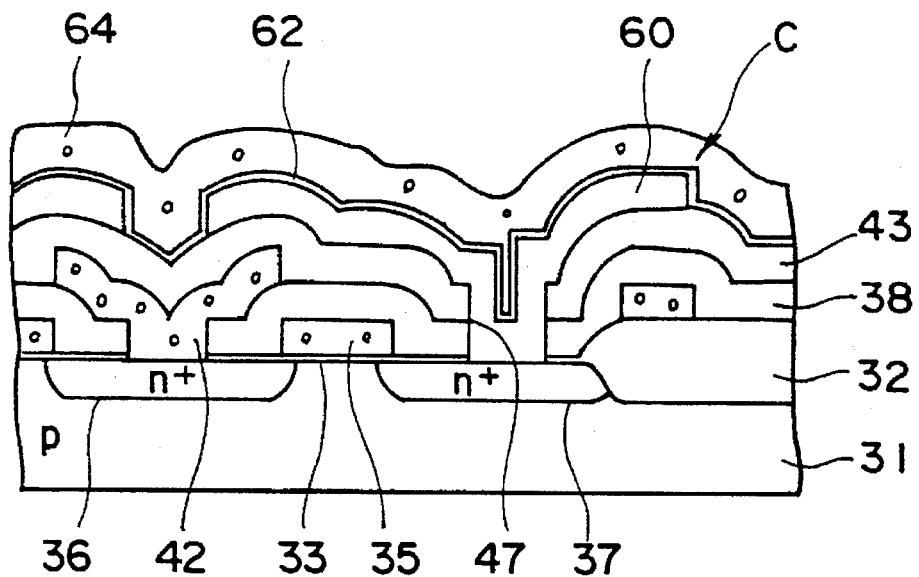
FIG. 12 is a diagram showing another modification of the dynamic random access memory fabricated by the first embodiment process of the present invention.

FIG. 12 shows another example of the dynamic random access memory of the present invention corresponding to a modification of the first embodiment. In the present embodiment, the stacked memory cell capacitor C has only one electrode fin 60. Similarly to the first embodiment, the electrode fin 60 forming stacked fin electrode C is formed by depositing silicon in the amorphous state by the CVD process of disilane conducted at 450° C. On the surface of the electrode fin 60, a dielectric film 62 is formed similarly to the dielectric film 53, and an opposing electrode 64 of polysilicon is provided to bury the stacked fin electrode 60 underneath. As the rest of the feature of the device of FIG. 12 is substantially identical with the device described previously, further description will be omitted.

Figure 13:
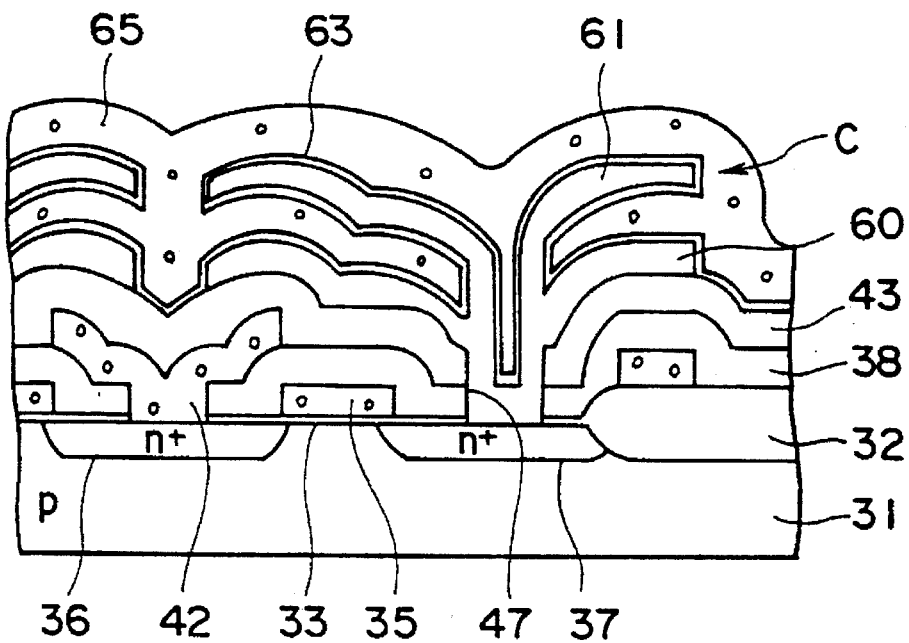
FIG. 13 is a diagram showing still another modification of the dynamic random access memory fabricated by the first embodiment process of the present invention.

FIG. 13 shows still another modification wherein the stacked fin capacitor C has two electrode fins 60 and 61 both formed as amorphous silicon layers. In the present modification, the parts other than the stacked fin capacitor C are fabricated similarly to the previous embodiments. In the fabrication of the device of FIG. 13, an amorphous silicon layer is deposited directly on the silicon nitride etching stopper 43, and the oxide layer and amorphous silicon layer are stacked alternately on the amorphous silicon layer thus formed. As the rest of the feature of the present invention is obvious from the preceding description, further description will be omitted.

Next, a second embodiment of the present invention for eliminating the deformation of the electrode fin will be described with reference to FIG. 14.

Figure 14:
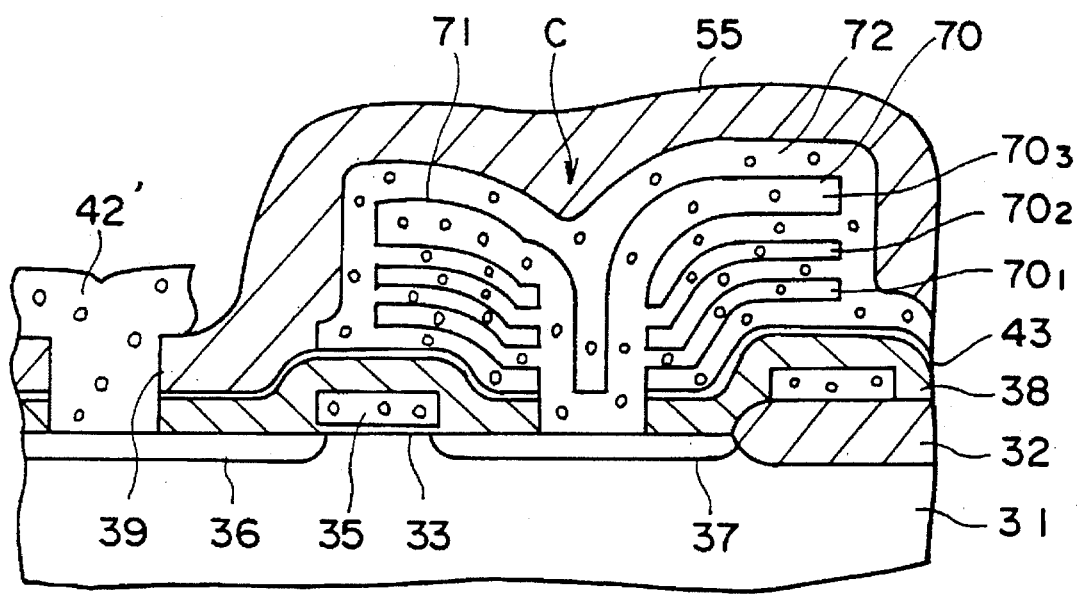
FIG. 14 is a diagram showing the structure of a dynamic random access memory according to a second embodiment of the present invention.

Referring to FIG. 14, it will be noted that the dynamic random access memory according to the present embodiment has a structure generally identical with the structure of the device of the previous embodiments except that the stacked fin capacitor C has three electrode fins $70_1$–$70_3$ of polysilicon forming a stacked fin electrode 70. The stacked fin electrode 70 is thereby formed of polysilicon and is covered by a dielectric film 71 as usual. Further, an opposing electrode 72 of polysilicon covers the surface of the stacked fin electrode 70 such that the dielectric film 71 is sandwiched between the electrodes 70 and 72.

Figure 15:
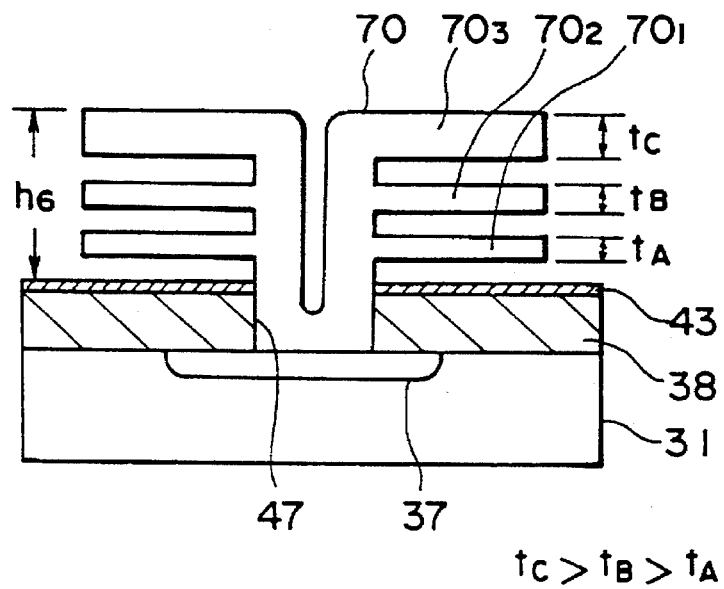
FIG. 15 is a diagram showing a modification of the device of FIG. 14.

On the other hand, the device of the present embodiment is different from the previously described device in that the thickness of the electrode fin is changed depending upon the level thereof such that the fin $70_3$ at the top of the stacked fin electrode 70 has an increased thickness as compared with the other electrode fins $70_1$ and $70_2$ locating at the lower level. Thereby, the deformation of the electrode fin that occurs particularly conspicuous in the electrode fin $70_3$ at the top of the electrode 70 due to the cumulative thermal stress, is successfully eliminated. As already noted, the deposition of the polysilicon layer forming the electrode fin and the silicon oxide layer to be etched away later induces a thermal stress at the interface between the polysilicon layer and such a thermal stress is accumulated from the lower level fin to the upper level fin. On the other hand, the result of FIG. 8 clearly indicates that one can reduce or eliminate the deformation of the electrode fin when the thickness of the fin is increased. Thus, the present embodiment uses a thickness of 20 nm for the fins $70_1$ and $70_2$, while a thickness of 50 nm is used for the fin $70_3$. Of course, one may form the stacked fin electrode 70 in the form of amorphous silicon instead of polysilicon. Further, one may increase the thickness of the fins gradually from the bottom to the top as indicated in FIG. 15.

Next, a third embodiment of the present invention will be described first with reference to FIGS. 16(A)–16(C) and FIGS. 17(A)–17(C) and later with reference to FIG. 18(A)–18(F).

Figure 1D:
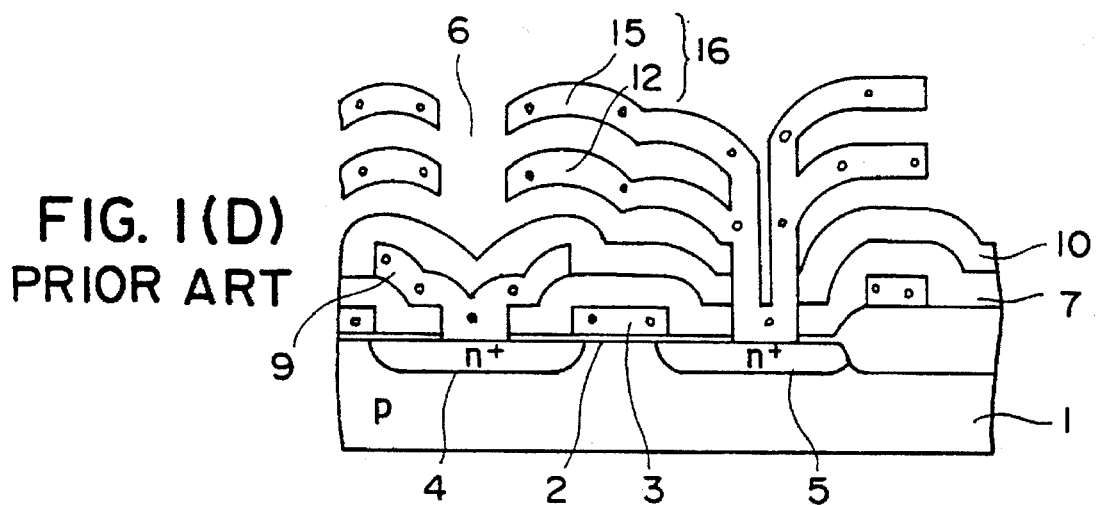
Figure 1E:
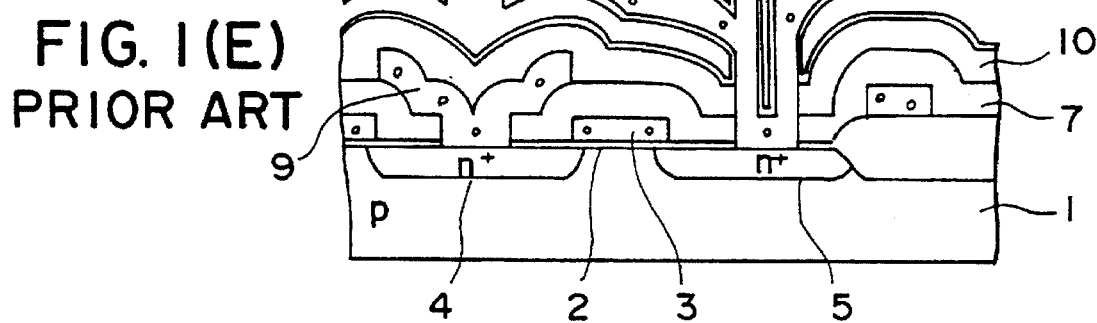
Figure 1F:
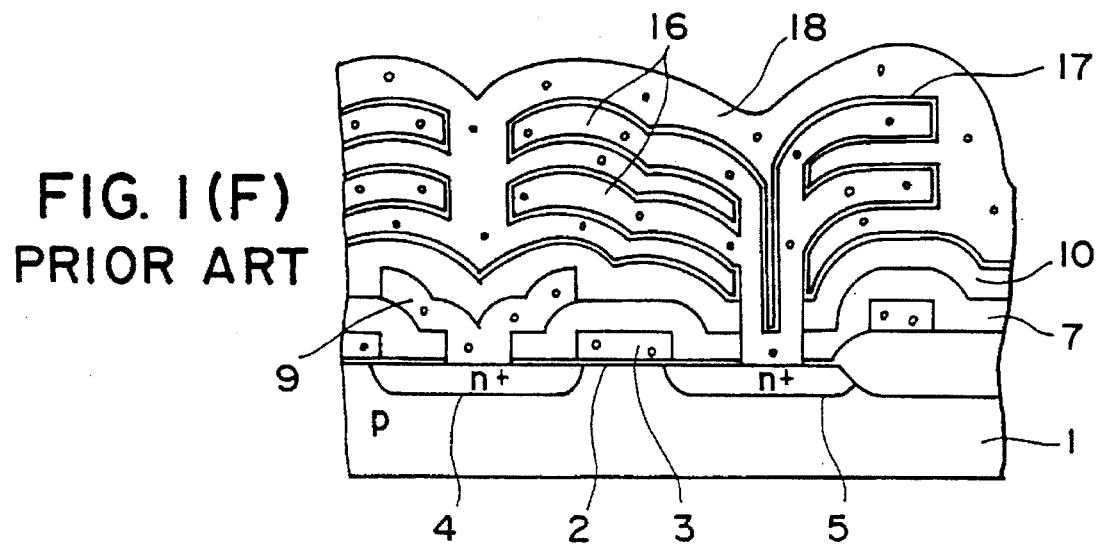

In the investigation conducted in search of the possible cause of the electrode fin deformation, the inventor of the present invention has discovered that the deformation occurs not only at the time of the deposition of the dielectric film but also at the time when the silicon oxide layer is removed by the wet etching process as in the step of FIG. 1(D). More particularly, it was discovered that the fin deformation can occur when the stacked fin electrode is dried after the wet etching has been completed. It was discovered further that such a deformation can occur in the deformation-free device when the device is immersed in purified water and dried subsequently.

Figure 16A:
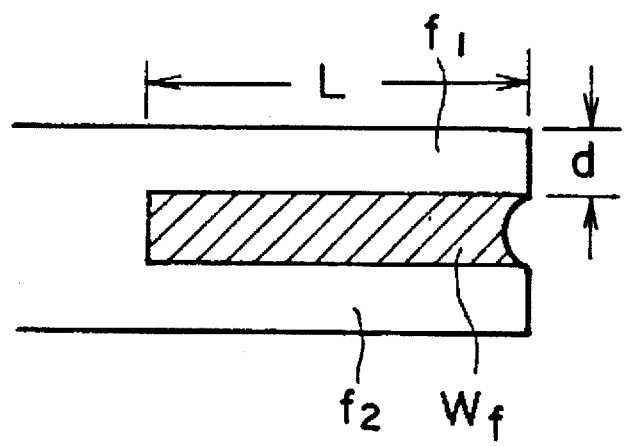
FIGS. 16(A)–16(C) are diagrams showing a mechanism of occurrence of the deformation of the electrode fin in the conventional fabrication process of the dynamic random access memory that employs a wet etching process for the formation of the stacked fin memory cell capacitor.
Figure 16B:
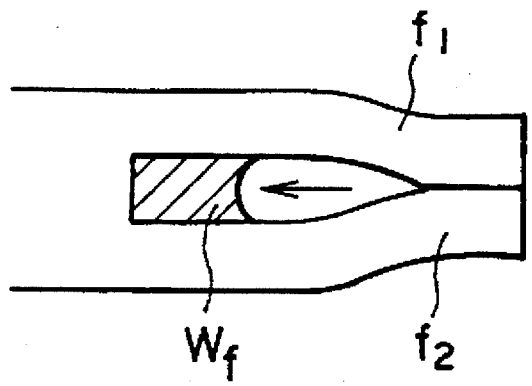
Figure 16C:
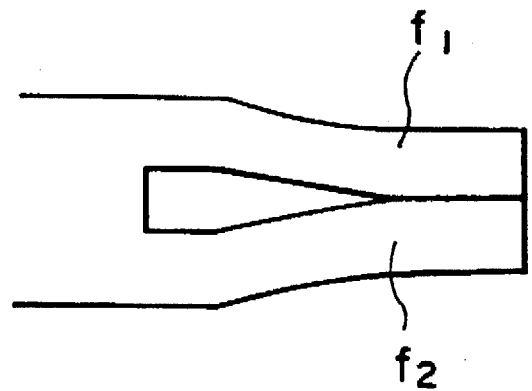

FIGS. 16(A)–16(C) show the possible mechanism of such a deformation of the electrode fin. As shown in FIG. 16(A) showing the state wherein a water film $w_f$ fills the gap between adjacent electrode fins $f_1$ and $f_2$, a surface tension acts at the interface between the water film $w_f$ and the electrode fin $f_1$ or $f_2$. With the evaporation occurring as shown in FIG. 16(B), the electrode fin starts to bend as a result of the surface tension, and the deformation propagates toward the root part of the fin with the progress of the evaporation.

Further, it was discovered that the deformation occurs also when the etching of the silicon oxide layer is achieved by a dry etching process that uses a vapor mixture of HF and $H_2O$.

Figure 17A:
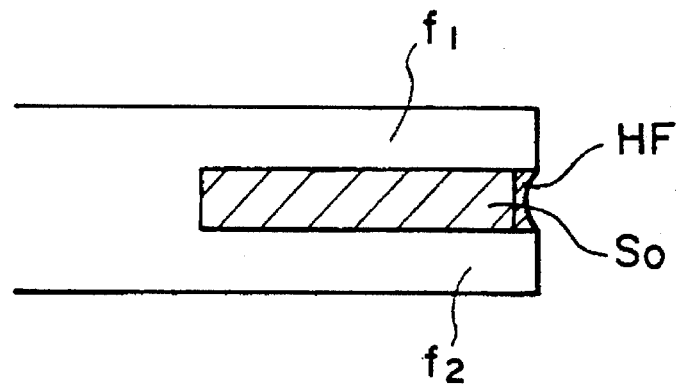
FIGS. 17(A)–17(C) are diagrams similar to FIGS. 16(A)–16(C) showing a mechanism of occurrence of the deformation of the electrode fin in the conventional fabrication process of the dynamic random access memory that employs a dry etching process for the formation of the stacked fin memory cell capacitor.
Figure 17B:
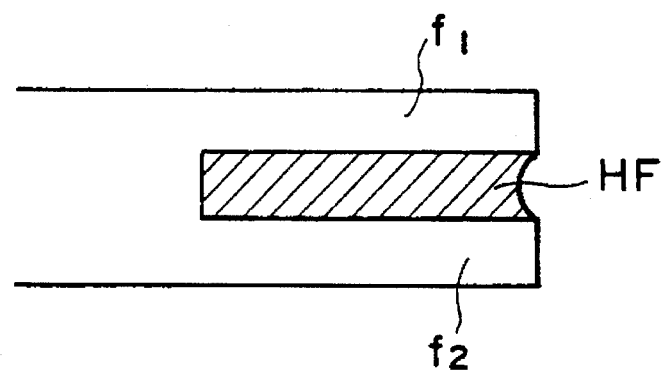
Figure 17C:
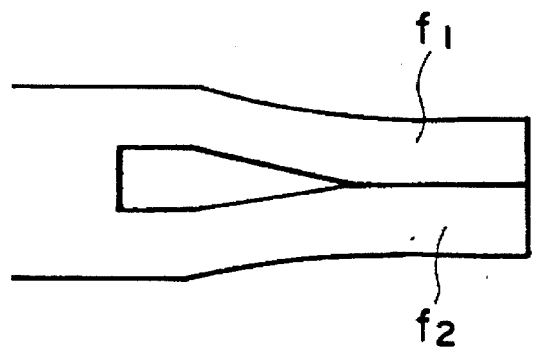

FIG. 17(A) shows the state wherein the dry etching process by the mixture of a HF vapor and a $H_2O$ vapor has just started. There, it can be seen that the gap between the adjacent fins $f_1$ and $f_2$ is still filled by a silicon oxide film $S_O$ to be etched, with the outer marginal part of the silicon oxide film $S_O$ slightly etched away. In correspondence to the part that has been etched, there is formed a film of a HF/$H_2O$ fluid which is an aqueous solution of HF. With the progress of the etching, the silicon oxide film $S_O$ is removed completely and the gap is now filled completely by the film of the HF/$H_2O$ fluid. When the HF film is removed by drying, the surface tension acting at the surface of the fin causes the bending as shown in FIG. 17(C).

In the effort to eliminate these problems that occur particularly at the time of drying, the inventor of the present invention has discovered that a stepwise and alternate progress of etching and drying can solve the problem of bending. Hereinafter, this finding will be explained with reference to FIGS. 18(A)–18(F).

Figure 18A:
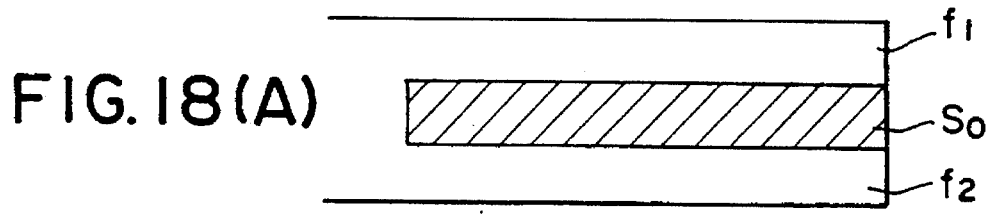
FIG. 18(A)–18(F) are diagrams showing a second embodiment process of the present invention for eliminating the deformation of the electrode fin.

FIG. 18(A) shows the state before the etching is started. As shown in FIG. 18(A), there is formed a silicon oxide film $S_O$ between a pair of adjacent silicon electrode fins $f_1$ and $f_2$.

Figure 18B:
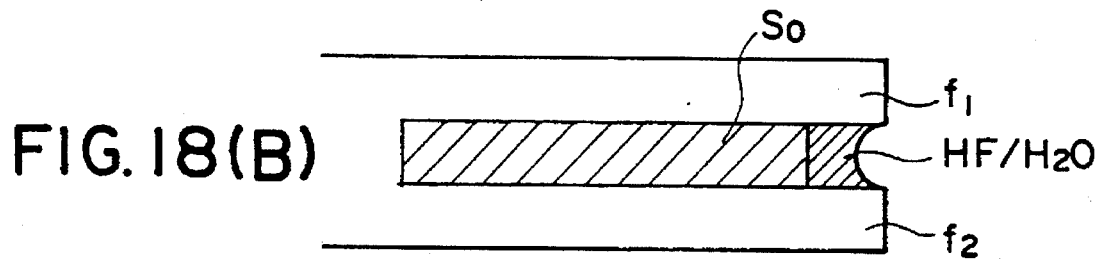

In the step of FIG. 18(B), the outermost part of the silicon oxide film $S_O$ is etched away by a mixture of HF and $H_2O$ that are condensed from a vapor mixture of HF and $H_2O$. In this state, it is believed that reactions such as $$2HF + H_2O \rightarrow H_3O^+ + HF_2^- \qquad (1)$$

$$SiO_2 + 2H_3O^+ + 2HF_2^- \rightarrow SiF_4 + 4H_2O \qquad (2)$$

$$SiO_2 + H_3O^+ + 3HF_2^- \rightarrow SiF_6^{2-} + 3H_2O \qquad (3)$$

take place.

First, the reaction (1) occurs between the HF vapor and the water vapor. This reaction may occur for example at the exposed surface of the silicon oxide film $S_O$. Next, the second reaction (2) occurs at the exposed surface of the silicon oxide film $S_O$, and the silicon oxide film is etched by releasing $SiF_4$. The compound $SiF_4$ is volatile and evaporate immediately upon formation. Further, the third reaction (3) occurs when $H_2O$ is formed as a result of the reaction (2).

Thereby, the etching reaction is enhanced by releasing $SiF_6^{2-}$ which also evaporates upon formation.

When the reaction is continued in the state of FIG. 18(B), the etching proceeds deeply into the space or gap formed between the electrode fins and the gap is filled by the fluid $HF/H_2O$. It should be noted that this situation is exactly the same as the situation in FIG. 17(B). Upon evaporation of the fluid between the gap, the bending of the electrode fin cannot be avoided.

The present embodiment avoids the problem of bending of the electrode fins by interrupting the etching process before the etching proceeds to the extent that the gap between the fins is filled by the fluid of the reaction product. More specifically, the supply of the HF vapor and $H_2O$ vapor is interrupted before the gap is filled by the fluid, and the supply of the etching gas is replaced with the supply of dry $N_2$. As a result of the supply of dry $N_2$, the fluid is removed as shown in FIG. 18(C).

Figure 18C:
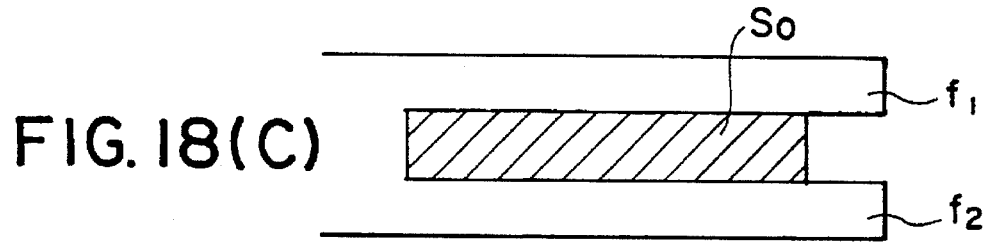
Figure 18D:
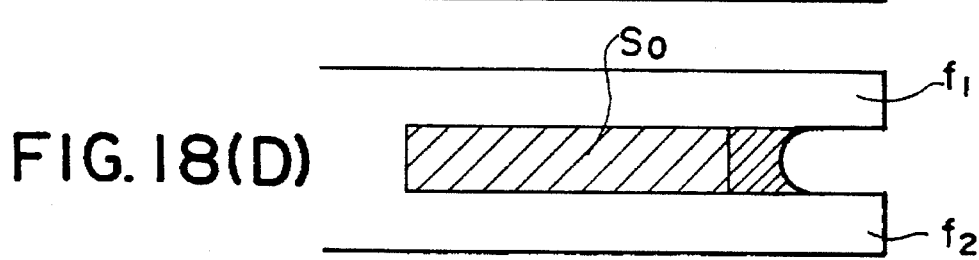

In the state of FIG. 18(C), a substantial part of the silicon oxide film $S_O$ remains unetched, and the etching process is restarted by resuming the supply of the HF vapor and $H_2O$ vapor. Again, the etching is interrupted before the gap is filled completely by the fluid by interrupting the supply of the $HF/H_2O$ vapor. See FIG. 18(D).

Figure 18E:
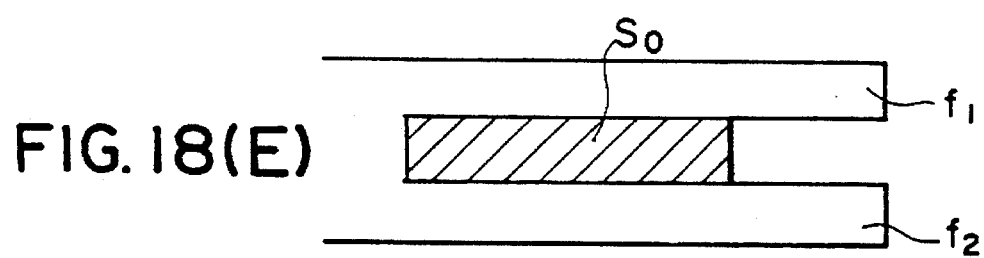
Figure 18F:
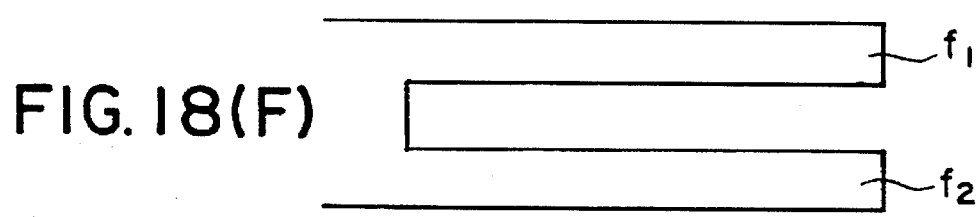

After the supply of the vapor is interrupted, the reactant fluid filling the gap partially is removed by supplying a dry $N_2$ gas. Thereby, a state as shown in FIG. 18(E) is obtained. Thus, by repeating the supply of the vapor and the supply of dry $N_2$ alternately, one can obtain the structure shown in FIG. 18(F) wherein the silicon oxide film $S_O$ is eliminated completely while maintaining the electrode fins $f_1$ and $f_2$ substantially free from deformation.

It should be noted that the technique described with reference to the third embodiment is particularly useful for extending the deformation-free region as defined in FIG. 8 particularly with respect to the device that has the stacked fin electrode formed as amorphous silicon.

Further, one may avoid the problem of a formation of the electrode fin associated with the etching by employing amorphous carbon for the material filling the gap between the electrode fins. In this approach, the steps corresponding to FIG. 9(C) for depositing the layers 44 and 46 are achieved by a plasma enhanced CVD process that employs acetylene ($C_2H_2$) for the source gas. The acetylene is diluted by He or Ar, and the deposition is achieved at a pressure of 1 Torr and a temperature of 200° C., while supplying an RF power of 32 watts at the industrial statutory frequency of 13.56 MHz. Thereby, amorphous carbon layers are formed for the layers 44 and 46. The etching for forming the contact hole 47 corresponding to the process of FIG. 9(D) is achieved by an RIE process conducted in the atmosphere containing oxygen. Further, the etching process corresponding to FIG. 9(F) for removing the carbon layers 44 and 46 is achieved by a plasma etching process conducted in the atmosphere containing oxygen. In the present embodiment, the problem of surface tension caused by the fluid reactant is eliminated and the formation of the stacked fin capacitor with deformation-free electrode fins is guaranteed.

Other objects and further features of the present invention will become apparent from the following detailed description when read in conjunction with the attached drawings.

What is claimed is:

1. A method for fabricating a dynamic random access memory comprising the steps of:

forming a diffusion region of a first conductivity type in a semiconductor substrate of a second, opposite conductivity type;

providing an insulation layer on said semiconductor substrate;

forming a contact hole in said insulation layer such that said diffusion region is exposed at said contact hole;

depositing a conductor layer on an upper major surface of said insulation layer in the amorphous state such that said conductor layer invades into said contact hole;

patterning said conductor layer to form a capacitor electrode such that said capacitor electrode is defined by a side wall and such that said capacitor electrode is in contact with said diffusion region at said contact hole;

depositing a dielectric film on said capacitor electrode such that said dielectric film covers an upper major surface of said capacitor electrode and further said exposed side wall; and depositing a conductor material to form an opposing electrode such that said opposing electrode buries said capacitor electrode underneath while establishing an intimate contact with said dielectric film that covers said capacitor electrode.

2. A method as claimed in claim 1, in which said step of depositing the conductor material is achieved by a CVD process at a temperature below about 500° C.

3. A method as claimed in claim 2, in which said CVD process is conducted by a thermal decomposition of disilane at a temperature of about 450° C.

4. A method as claimed in claim 2, in which said CVD process is conducted by a thermal decomposition of trisilane at a temperature of between 350° C.–500° C.

5. A method as claimed in claim 1, in which said method further comprises the steps, between said step of forming the diffusion region and said step of providing the insulation layer, of: depositing an etching stopper layer which is immune to an etching process, on said substrate; and depositing consecutively a second insulation layer and a second conductor layer on said etching stopper layer such that said second conductor layer is deposited in the amorphous state, wherein said method further comprises a step of removing said first and second insulation layers by an etching process which acts selectively upon said first and second insulation layers while leaving said etching stopper layer and said capacitor electrode substantially intact.

6. A method as claimed in claim 1, in which said method further comprises the steps, between said step of forming the diffusion region and said step of providing the insulation layer, of: depositing an etching stopper layer which is immune to an etching process, on said substrate; and removing said insulation layer by an etching process which acts selectively upon said insulation layer while leaving said etching stopper layer and said capacitor electrode substantially intact.

7. A method as claimed in claim 5, in which said step of depositing the second insulation layer and the second conductor layer consecutively is repeated a plurality of times.

8. A method as claimed in claim 5, in which said step of depositing the dielectric film is conducted such that said dielectric film covers further an exposed surface of said second conductor layer.

9. A method as claimed in claim 5, in which said first and second conductor layers comprise silicon, and said first and second insulation layers comprise silicon oxide.

10. A method for fabricating a dynamic random access memory comprising the steps of:

forming a diffusion region of a first conductivity type in a semiconductor substrate of a second, opposite conductivity type;

deposing consecutively an etching stopper layer which is immune to an etching process and an insulation layer, on said substrate;

forming a contact hole in said insulation layer to penetrate through said etching stopper layer such that said diffusion region is exposed at said contact hole;

depositing a conductor layer on said insulation layer such that said conductor layer invades into said contact hole;

patterning said conductor layer together with said insulation layer located underneath to form a capacitor electrode such that said capacitor electrode is defined by a side wall and such that said capacitor electrode is in contact with said diffusion region at said contact hole;

removing said insulation layer by an etching process that acts selectively upon said insulation layer;

depositing a dielectric film on said capacitor electrode such that said dielectric film covers an exposed surface of said capacitor electrode; and depositing a conductor material to form an opposing electrode such that said opposing electrode buries said capacitor electrode underneath while establishing an intimate contact with said dielectric film that covers said capacitor electrode;

said step of removing said insulation layer comprising a dry etching process using a vapor mixture of HF and $H_2O$ conducted intermittently in the form of a plurality of etching steps with an intervening drying process interposed between said etching steps, wherein each etching step is interrupted before a gap formed between said conductor layer and said etching stopper as a result of etching is filled completely by a fluid formed as a result of the etching.

11. A method for fabricating a dynamic random access memory comprising the steps of:

forming a diffusion region of a first conductivity type in a semiconductor substrate of a second, opposite conductivity type;

depositing an etching stopper layer which is immune to an etching process, on said substrate;

depositing consecutively a first conductor layer and an insulation layer on said etching stopper layer;

forming a contact hole in said insulation layer to penetrate through said conductor layer and further through said etching stopper layer such that said diffusion region is exposed at said contact hole;

depositing a second conductor layer on an upper major surface of said insulation layer such that said conductor layer invades into said contact hole;

patterning said first and second conductor layers together with said insulation layer interposed therebetween to form a capacitor electrode such that said capacitor electrode is defined by a side wall and such that said capacitor electrode is in contact with said diffusion region at said contact hole;

removing said insulation layer by an etching process that acts selectively upon said insulation layer;

depositing a dielectric film on said capacitor electrode such that said dielectric film covers an exposed surface of said capacitor electrode; and depositing a conductor material to form an opposing electrode such that said opposing electrode buries said capacitor electrode underneath while establishing an intimate contact with said dielectric film that covers said capacitor electrode;

said step of removing said insulation layer comprises a dry etching process using a vapor mixture of HF and $H_2O$ conducted intermittently in the form of a plurality of etching steps with an intervening drying process interposed between said etching steps, wherein each etching step is interrupted before a gap formed between said first and second conductor layers as a result of etching is filled completely by a fluid formed as a result of the etching.

12. A method for fabricating a dynamic random access memory comprising the steps of:

forming a diffusion region of a first conductivity type in a semiconductor substrate of a second, opposite conductivity type;

depositing consecutively an etching stopper layer which is immune to an etching process and a spacer layer, on said substrate;

forming a contact hole in said spacer layer to penetrate through said etching stopper layer such that said diffusion region is exposed at said contact hole;

depositing a conductor layer on said spacer layer such that said conductor layer invades into said contact hole;

patterning said conductor layer together with said spacer layer located underneath to form a capacitor electrode such that said capacitor electrode is defined by a side wall and such that said capacitor electrode is in contact with said diffusion region at said contact hole;

removing said spacer layer by an etching process conducted under the existence of a gas plasma;

depositing a dielectric film on said capacitor electrode; and depositing a conductor material to form an opposing electrode such that said opposing electrode buries said capacitor electrode underneath while establishing an intimate contact with said dielectric film that covers said capacitor electrode.

13. A method for fabricating a dynamic random access memory comprising the steps of:

forming a diffusion region of a first conductivity type in a semiconductor substrate of a second, opposite conductivity type;

depositing an etching stopper layer which is immune to an etching process, on said substrate;

depositing consecutively a first conductor layer and a spacer layer on said etching stopper layer;

forming a contact hole in said spacer layer to penetrate through said semiconductor layer such that said diffusion region is exposed at said contact hole;

depositing a second conductor layer on an upper major surface of said spacer layer such that said conductor layer invades into said contact hole;

patterning said first and second conductor layers together with said insulation layer interposed therebetween to form a capacitor electrode such that said capacitor electrode is defined by a side wall and such that said capacitor electrode is in contact with said diffusion region at said contact hole;

removing said spacer layer by an etching process conducted under the existence of a gas plasma;

depositing a dielectric film on said capacitor electrode such that said dielectric film covers an exposed surface of said capacitor electrode; and depositing a conductor material to form an opposing electrode such that said opposing electrode buries said capacitor electrode underneath while establishing an intimate contact with said dielectric film that covers said capacitor electrode.

14. A method as claimed in claim 13 in which said spacer layer comprises amorphous carbon, and said gas plasma contains oxygen.

15. A dynamic random access memory, comprising:

a semiconductor substrate doped to a first conductivity type and having upper and lower major surfaces;

first and second diffusion regions doped to a second, opposite conductivity type and formed in said substrate with a mutual separation, said first and second diffusion regions forming thereby a channel region therebetween;

gate electrode means provided on said upper major surface of said substrate between said first and second diffusion regions for controlling conduction of carriers between said first and second diffusion regions thorough said channel region, said gate electrode means including a gate oxide film provided at said upper major surface of said substrate and a polysilicon strip provided on said gate oxide film as a gate electrode, said polysilicon strip extending over the upper major surface of the substrate as a word line;

an insulation layer provided on said upper major surface of said substrate to bury said gate electrode means underneath;

a first contact hole provided in said insulation layer for exposing said first diffusion region;

a polysilicon bit line provided on said insulation layer to extend over said substrate, said polysilicon bit line being formed in contact with said exposed first diffusion region at said first contact hole;

a second contact hole provided in said insulation layer for exposing said second diffusion region;

a stacked fin electrode of polysilicon provided in contact with said exposed second diffusion region at said second contact hole, said stacked fin electrode having one or more electrode fins each defined by upper and lower major surfaces and a side wall;

a dielectric film covering said stacked fin electrode including said upper and lower major surfaces and said side wall of said electrode fins; and an opposing electrode of polysilicon provided in intimate contact with said dielectric film such that said dielectric film is sandwiched between said stacked fin electrode and said opposing electrode;

said polysilicon forming said stacked fin electrode having a grain size substantially larger than a grain size of said opposing electrode or said bit line.

16. A dynamic random access memory, comprising:

a semiconductor substrate doped to a first conductivity type and having upper and lower major surfaces;

first and second diffusion regions doped to a second, opposite conductivity type and formed in said substrate with a mutual separation, said first and second diffusion regions forming thereby a channel region therebetween;

gate electrode means provided on said upper major surface of said substrate between said first and second diffusion regions for controlling conduction of carriers between said first and second diffusion regions thorough said channel region, said gate electrode means including a gate oxide film provided at said upper major surface of said substrate and a polysilicon strip provided on said gate oxide film as a gate electrode, said polysilicon strip extending over the upper major surface of the substrate as a word line;

an insulation layer provided on said upper major surface of said substrate to bury said gate electrode means underneath;

a first contact hole provided in said insulation layer for exposing said first diffusion region;

a polysilicon bit line provided on said insulation layer to extend over said substrate, said polysilicon bit line being formed in contact with said exposed first diffusion region at said first contact hole;

a second contact hole provided in said insulation layer for exposing said second diffusion region;

a stacked fin electrode of polysilicon provided in contact with said exposed second diffusion region at said second contact hole, said stacked fin electrode having a plurality of electrode fins each defined by upper and lower major surfaces and a side wall;

a dielectric film covering said stacked fin electrode including said upper and lower major surfaces and said side wall of said electrode fins; and an opposing electrode of polysilicon provided in intimate contact with said dielectric film such that said dielectric film is sandwiched between said stacked fin electrode and said opposing electrode;

each of said electrode fins forming said stacked fin capacitor having a thickness that is different from other electrode fins such that an electrode fin has a larger thickness as compared with the electrode fins located at a lower level.

17. A dynamic random access memory as claimed in claim 16 in which said plurality of electrode fins forming the stacked fin capacitor have an identical thickness except for the electrode fin that is located at the highest level such that said electrode fin at the highest level has a thickness that is larger than any other electrode fins.

18. A dynamic random access memory as claimed in claim 16 in which said thickness of the stacked fin capacitor increases gradually from the electrode fin at the lowest level to the electrode fin at the highest level.

19. A semiconductor memory device for storing information in the form of electric charges, comprising:

a semiconductor substrate having an upper major surface;

an active semiconductor device provided on said semiconductor substrate; and a memory cell capacitor provided in electrical connection with said active semiconductor device;

said memory cell capacitor comprising a stacked fin electrode of a conductor material provided on said upper major surface of said semiconductor substrate, said stacked fin electrode having one or more electrode fins each having upper and lower major surfaces, said conductor material forming the stacked fin having a first average grain size;

a dielectric film covering said upper and lower major surfaces of said electrode fins; and an opposing electrode of a conductor material provided on said stacked fin capacitor with an intimate contact with said dielectric film such that said dielectric film is sandwiched between said stacked fin electrode and said opposing electrode, said conductor material forming said opposing electrode having a second average grain size, wherein said first average grain size is substantially larger than said second average grain size.

* * * * *

UNITED STATES PATENT AND TRADEMARK OFFICE
CERTIFICATE OF CORRECTION

PATENT NO. : 5,661,340
DATED : Aug. 26, 1997
INVENTOR(S) : EMA et al.

It is certified that error appears in the above-identified patent and that said Letters Patent is hereby corrected as shown below:

Col. 1, line 24, after "therein" insert --,--.

Col. 2, line 29, after "as As" insert --is--.

Col. 3, line 1, change "an wet" to --a wet--; and change "a HF" to --an HF--.

Col. 7, line 42, change "conductions" to --conditions--.

Col. 10, line 23, change "to a result" to --as a result--.

Col. 12, line 49, change "150°" to --350°--.

Col. 13, line 34, change "sown" to --shown--.

Col. 16, line 65, change "evaporate" to --evaporates--.

Col. 20, line 56 (Claim 13, line 17), change "insulation layer" to --spacer layer--.

Col. 21, lines 18-19 (Claim 15, lines 12-13), change "thorough" to --through--;
lines 63-64 (Claim 16, lines 12-13), change "thorough" to --through--.

Signed and Sealed this

Third Day of February, 1998

Attest:

BRUCE LEHMAN

Attesting Officer

Commissioner of Patents and Trademarks